US012713729B2

(12) United States Patent
Itoh

(10) Patent No.: US 12,713,729 B2
(45) Date of Patent: Aug. 18, 2026

(54) SOLID-STATE IMAGING DEVICE TO REDUCE STRAY CAPACITANCE

(71) Applicant: SONY SEMICONDUCTOR SOLUTIONS CORPORATION, Kanagawa (JP)

(72) Inventor: Shinya Itoh, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 120 days.

(21) Appl. No.: 18/716,080

(22) PCT Filed: Oct. 17, 2022

(86) PCT No.: PCT/JP2022/038565
§ 371 (c)(1),
(2) Date: Jun. 3, 2024

(87) PCT Pub. No.: WO2023/105929
PCT Pub. Date: Jun. 15, 2023

(65) Prior Publication Data

US 2025/0040286 A1 Jan. 30, 2025

(30) Foreign Application Priority Data

Dec. 10, 2021 (JP) ................................ 2021-200728

(51) Int. Cl.
*H10F 39/00* (2025.01)
*H04N 25/709* (2023.01)
*H04N 25/77* (2023.01)

(52) U.S. Cl.
CPC ......... *H10F 39/811* (2025.01); *H04N 25/709* (2023.01); *H04N 25/77* (2023.01); *H10F 39/8037* (2025.01); *H10F 39/8057* (2025.01)

(58) Field of Classification Search
CPC ............... H10F 39/811; H10F 39/8037; H10F 39/8057; H10F 39/12; H04N 25/709; H04N 25/77
See application file for complete search history.

(56) References Cited

U.S. PATENT DOCUMENTS 8,648,943 B2 * 2/2014 Godaiin ............. H10F 39/8063 348/277
2021/0167114 A1 * 6/2021 Ogita ................. H10F 39/8067
(Continued)

FOREIGN PATENT DOCUMENTS

JP 2020-174188 A 10/2020
WO 2017/138197 A1 8/2017
(Continued)

OTHER PUBLICATIONS

International Search Report and Written Opinion of PCT Application No. PCT/JP2022/038565, issued on Dec. 27, 2022, 09 pages of ISRWO.

*Primary Examiner* — Gevell V Selby
(74) *Attorney, Agent, or Firm* — CHIP LAW GROUP

(57) ABSTRACT

A solid-state imaging device includes: a substrate including a first surface and a second surface that is opposed to the first surface; a first through-wiring that penetrates from the first surface of the substrate to the second surface of the substrate and through which electric charge is to be transferred; an electroconductive body formed in the substrate and along a periphery of a side surface of the first through-wiring with a dielectric body being interposed between the electroconductive body and the side surface; and a voltage supply circuit that supplies the electroconductive body with a voltage that causes a voltage difference between the first through-wiring and the electroconductive body to be small, when the electric charge is to be transferred to the first through-wiring.

12 Claims, 14 Drawing Sheets

(56) References Cited

U.S. PATENT DOCUMENTS

2022/0246666 A1* 8/2022 Kunitake .............. H10F 39/199
2022/0271073 A1* 8/2022 Togashi ................. H04N 25/76

FOREIGN PATENT DOCUMENTS

WO 2020/166309 A1 8/2020
WO 2020/255999 A1 12/2020

* cited by examiner

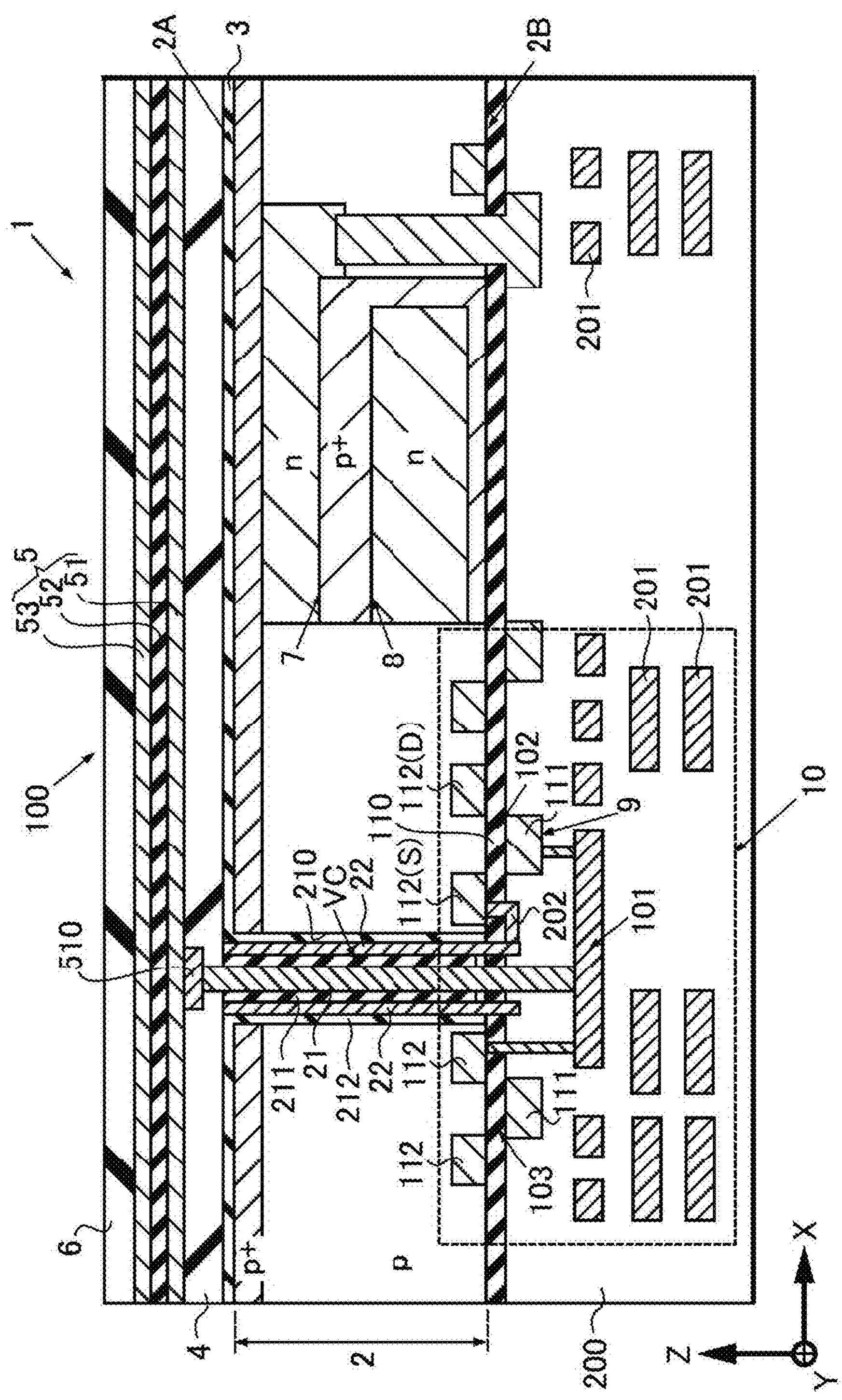
[FIG. 1]
1
100
2A
3
2B
5
53
52
51
510
6
4
2
200
p+
p
n
p+
n
7
8
210
VC
22
110
112(D)
112(S)
102
111
9
202
101
10
201
211
21
212
22
112
112
103
111
X
Z
Y

[ FIG. 2 ]
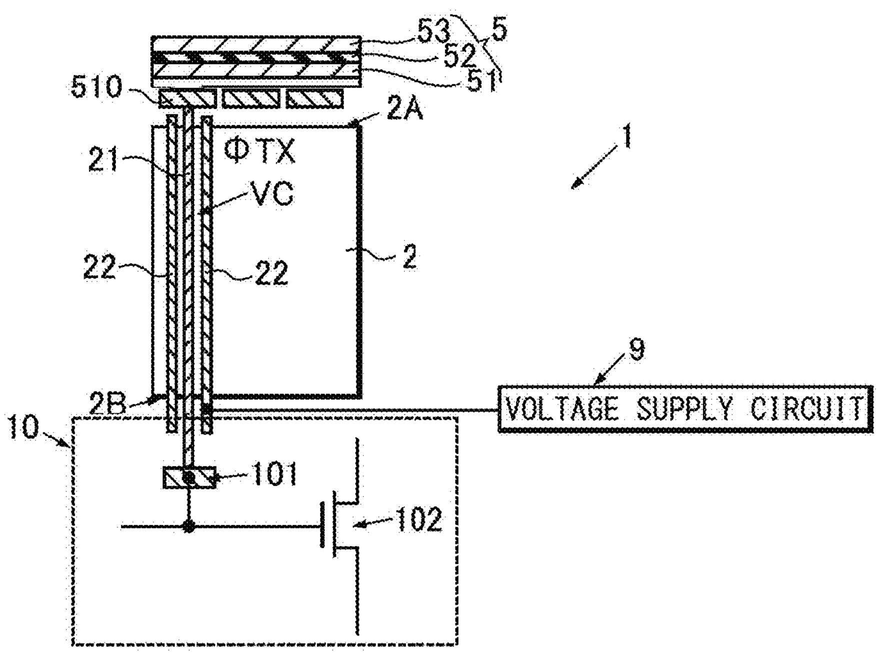
[ FIG. 3 ]
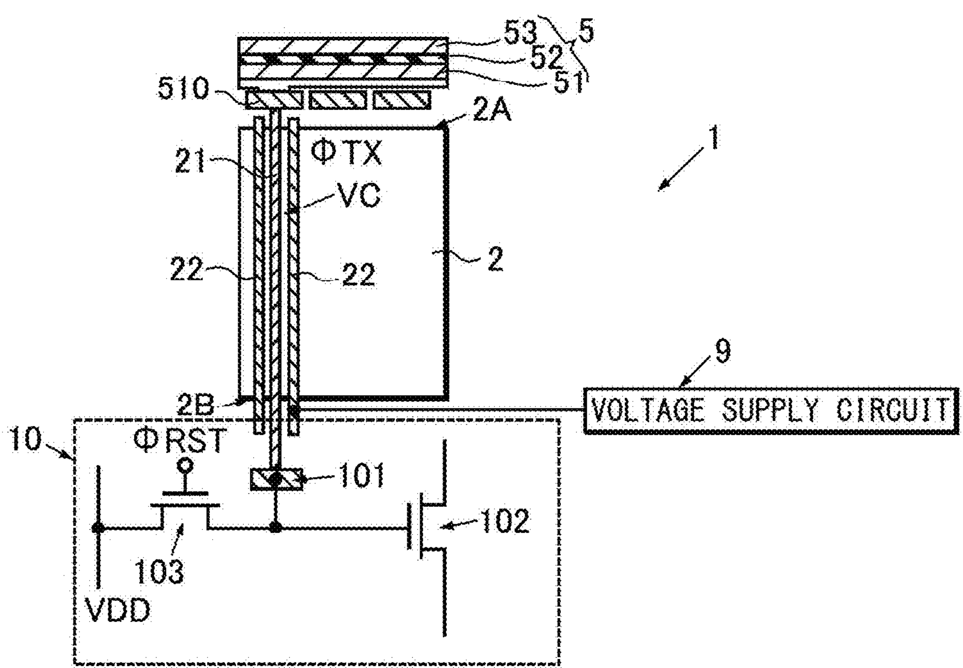

[ FIG. 4 ]
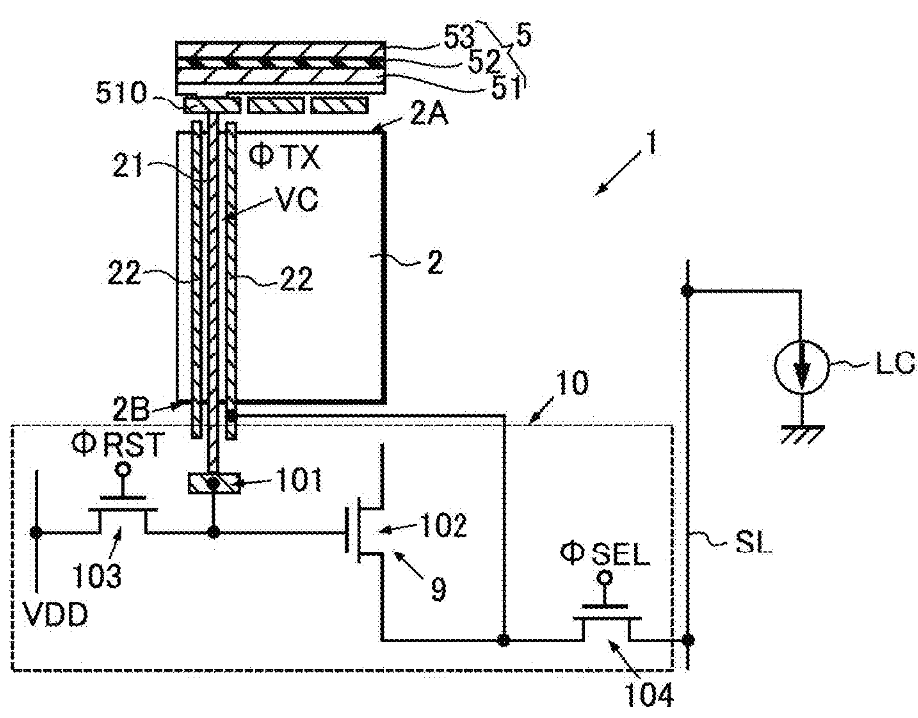
[ FIG. 5 ]
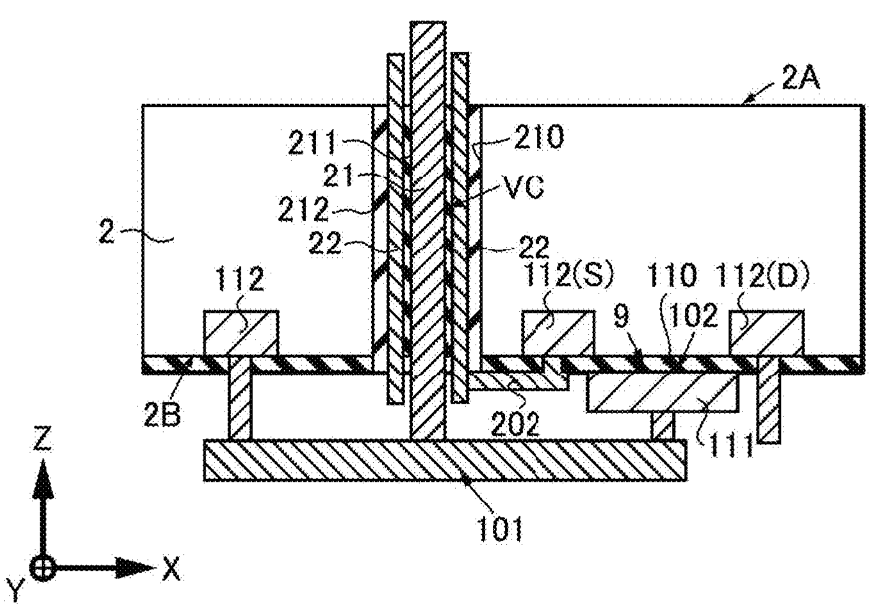

[ FIG. 6 ]
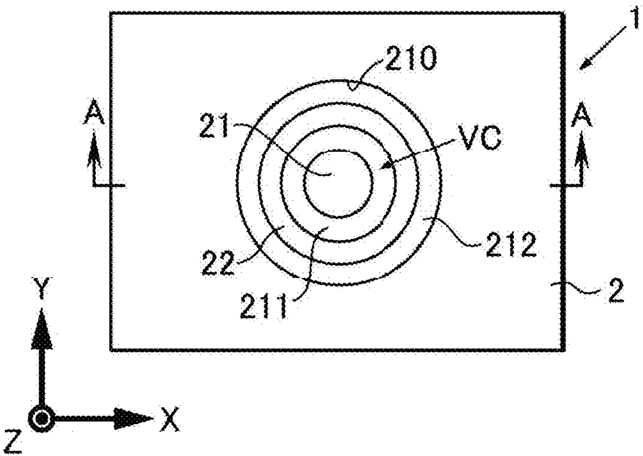
[ FIG. 7 ]
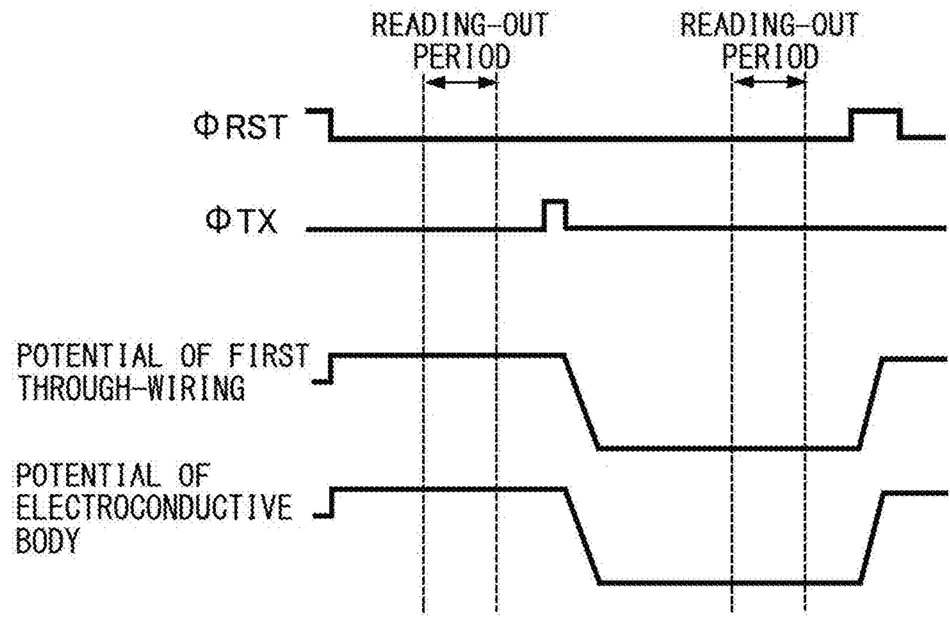

[ FIG. 8 ]
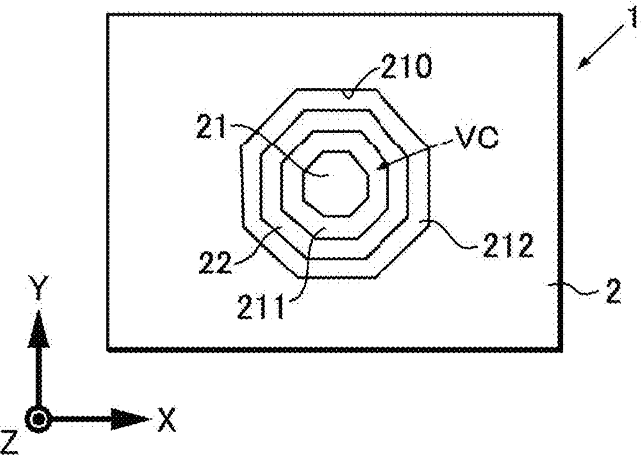
[ FIG. 9 ]
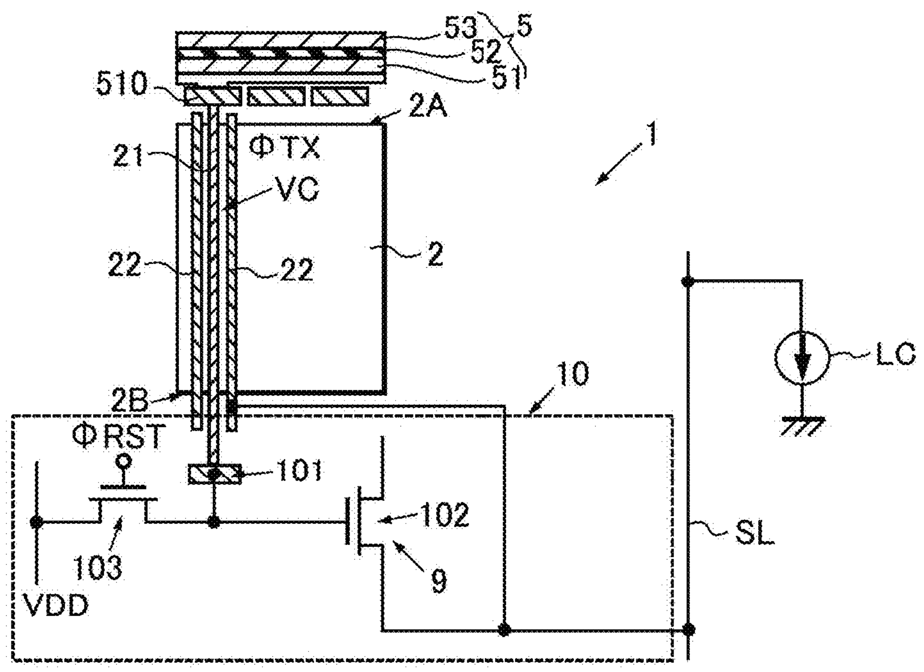

[ FIG. 10 ]
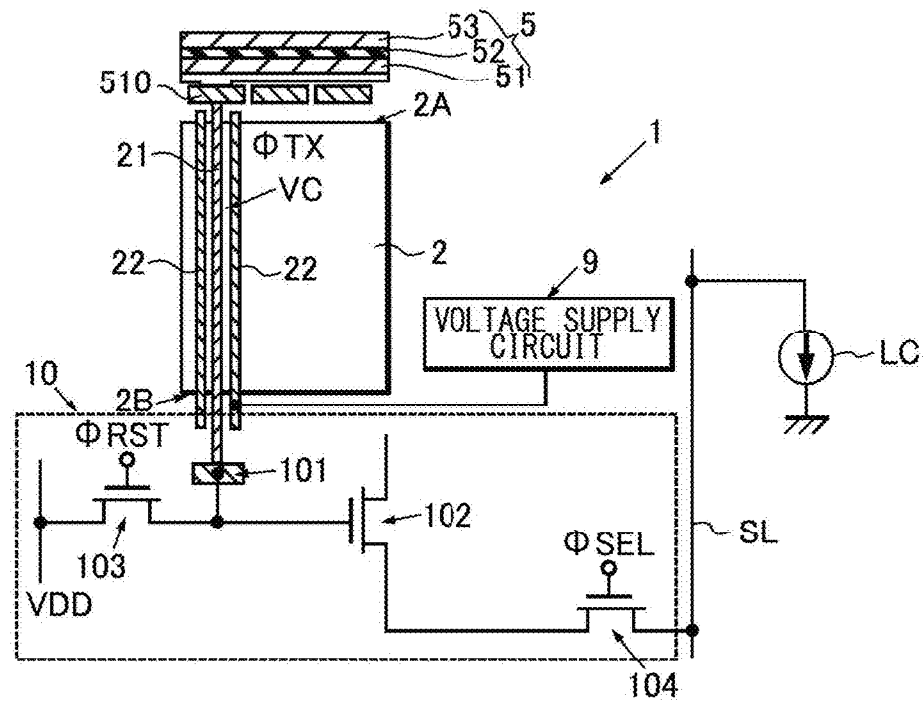
[ FIG. 11 ]
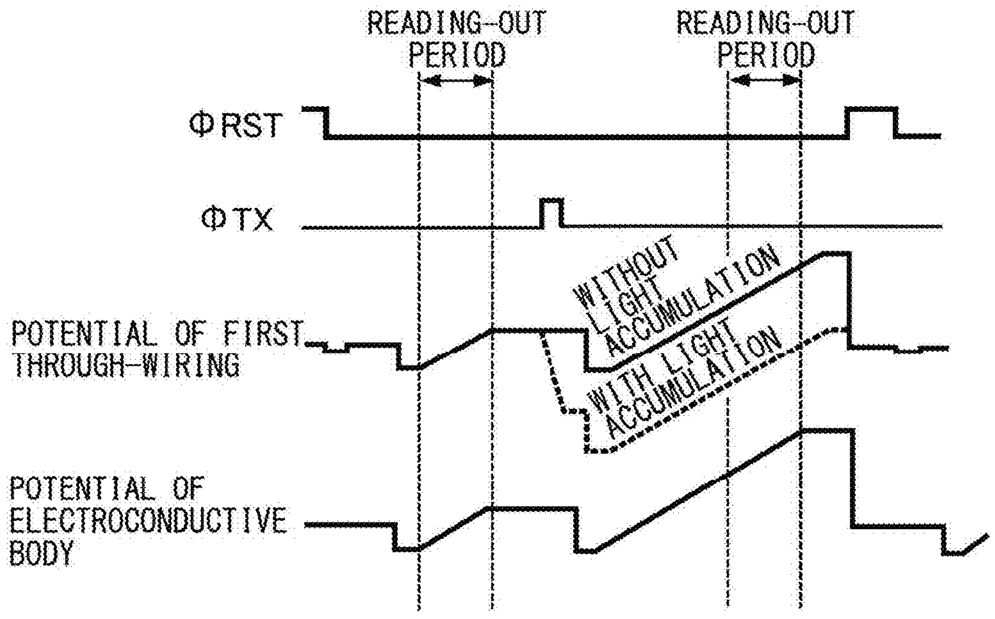

[ FIG. 12 ]
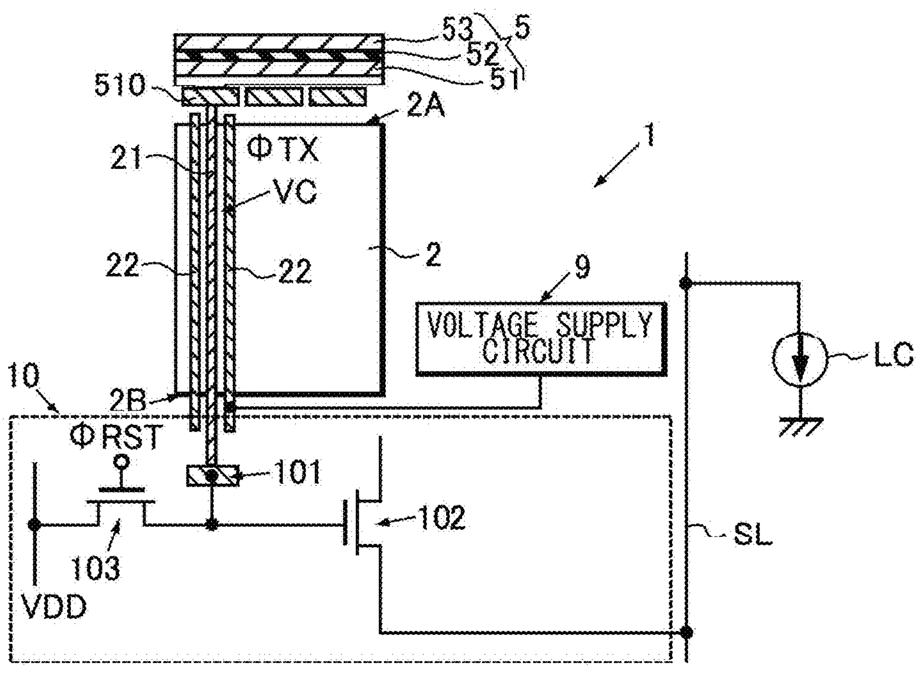
[ FIG. 13 ]
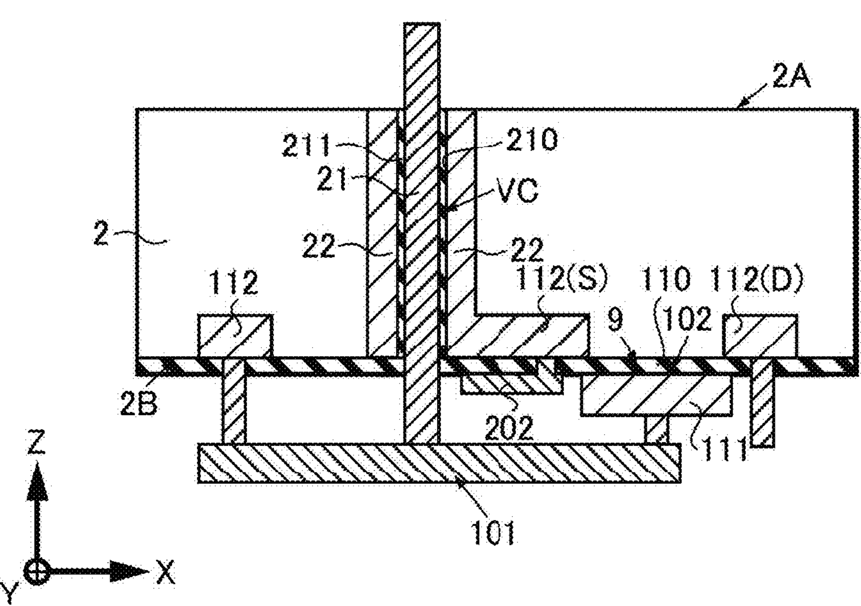

[ FIG. 14 ]
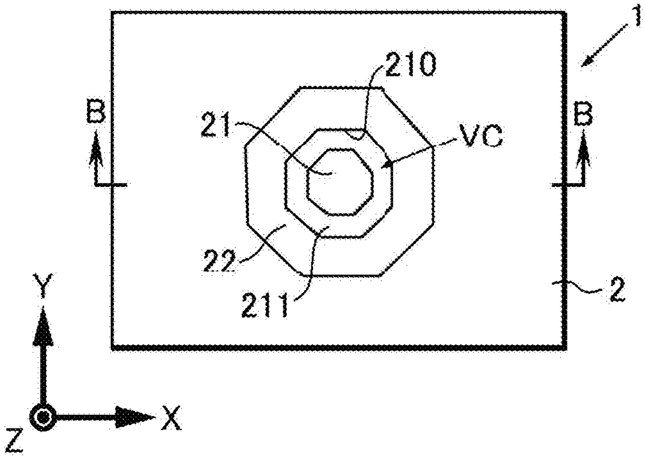
[ FIG. 15 ]
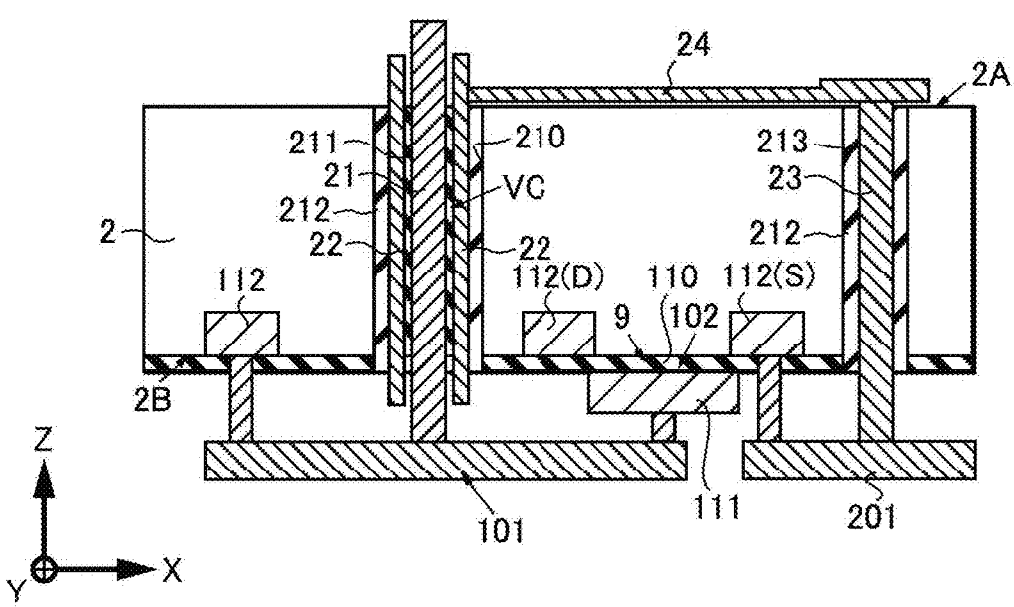

[ FIG. 16 ]
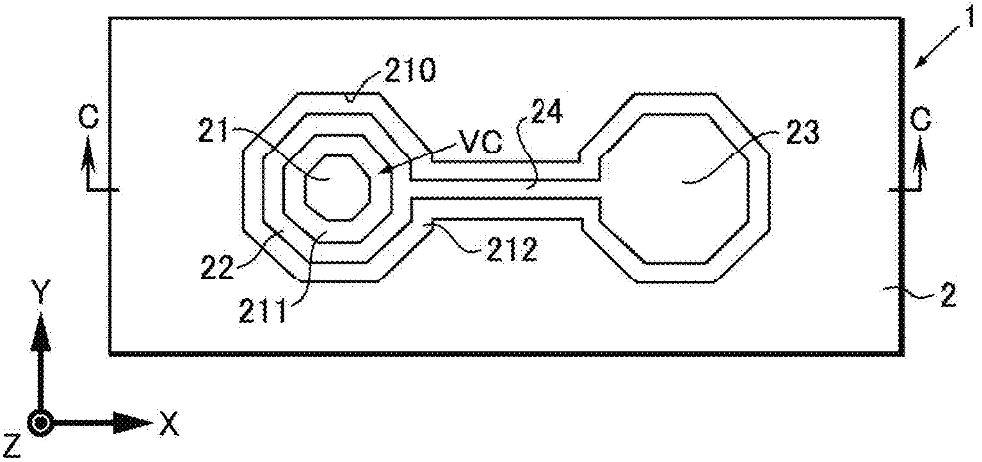
[ FIG. 17 ]
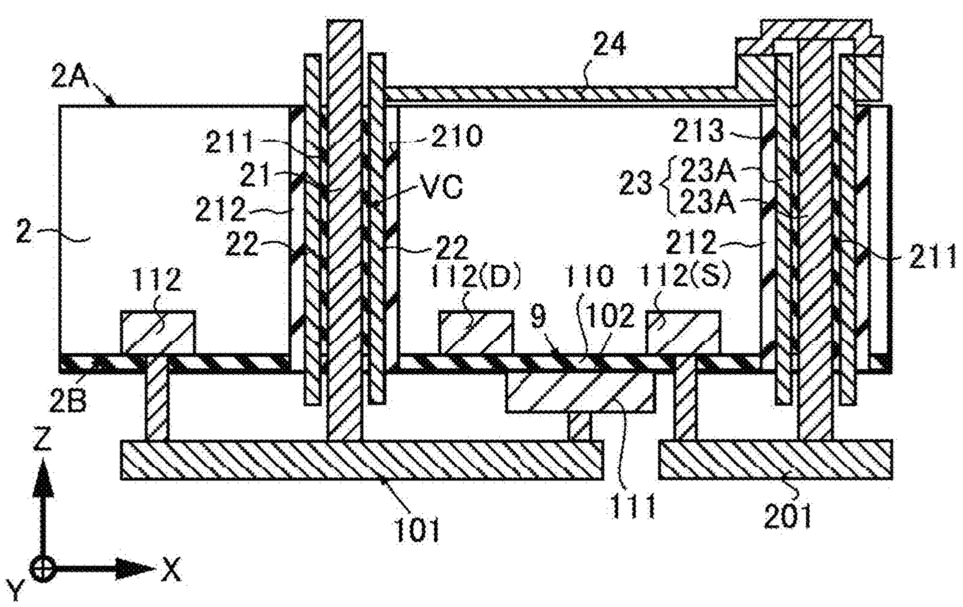

[ FIG. 18 ]
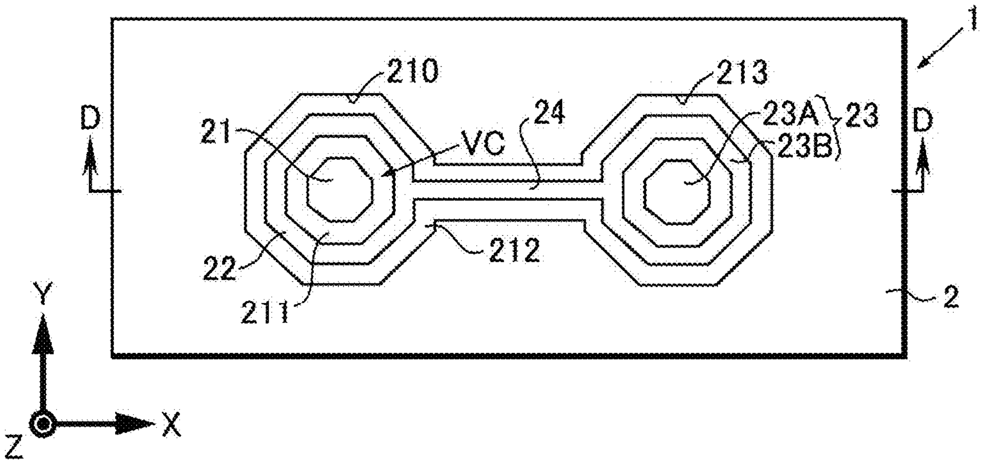
[ FIG. 19 ]
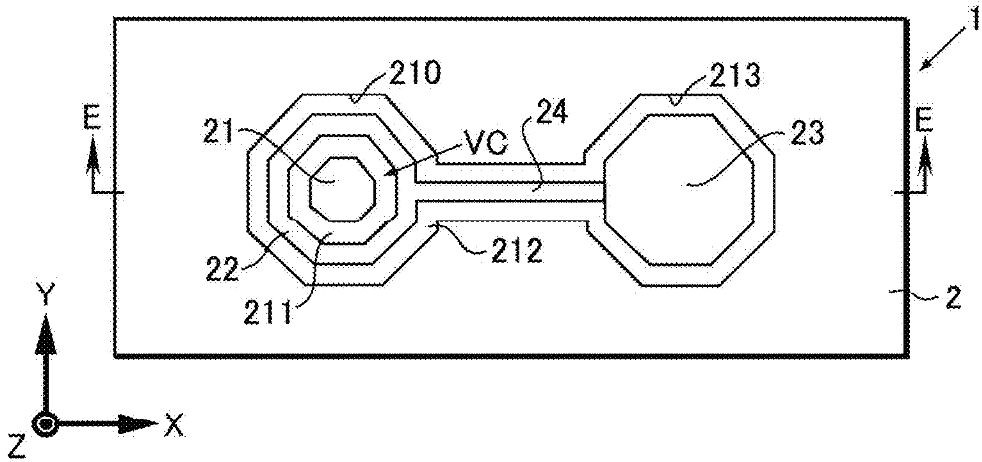

[ FIG. 20 ]
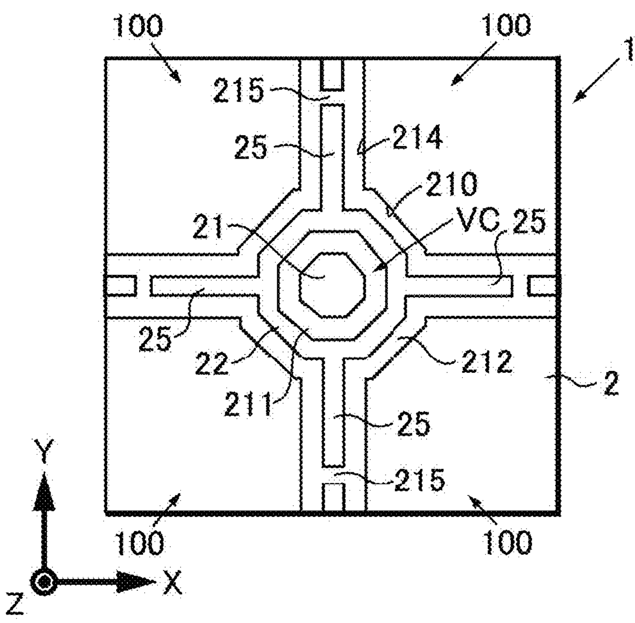

[ FIG. 21 ]
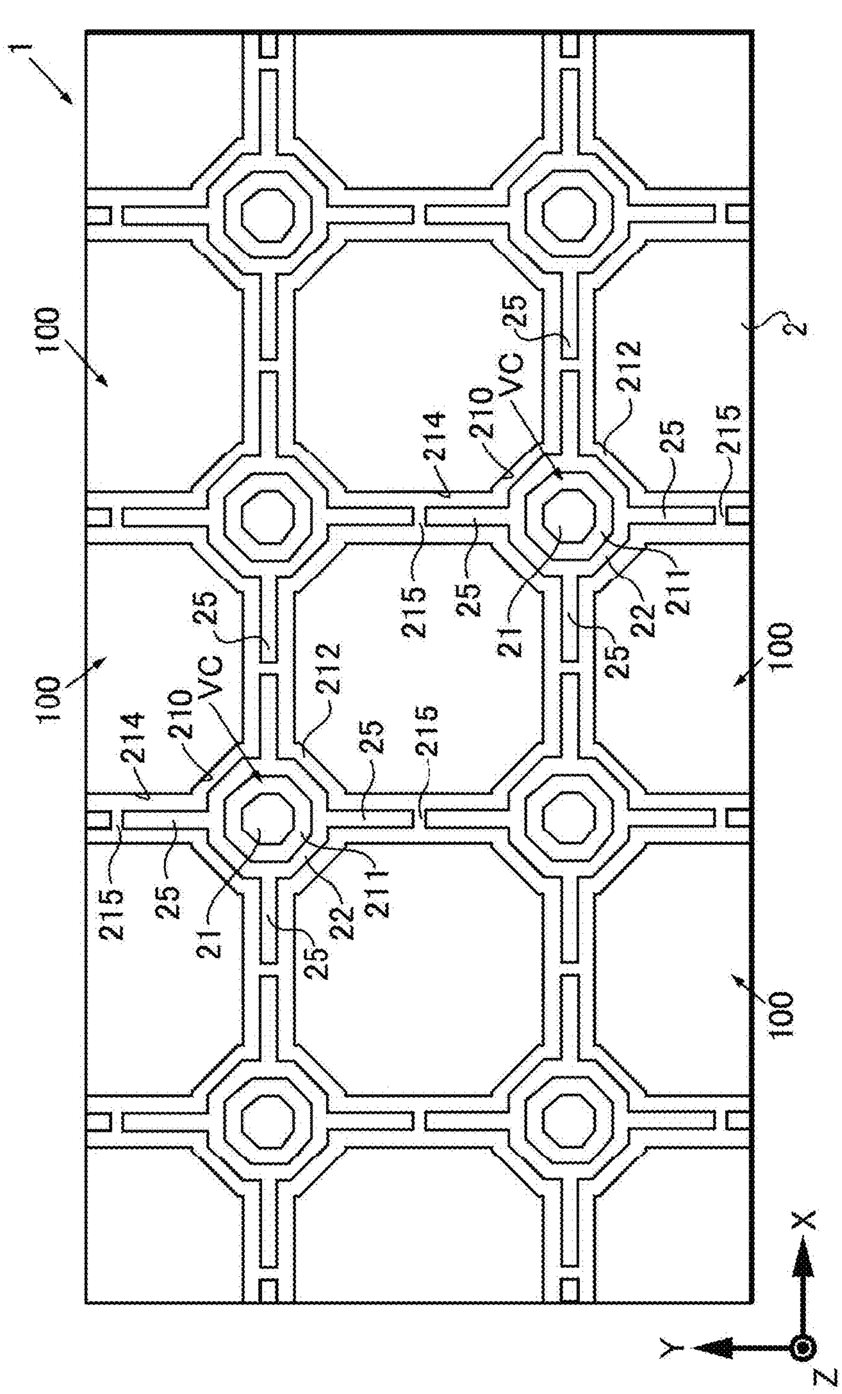

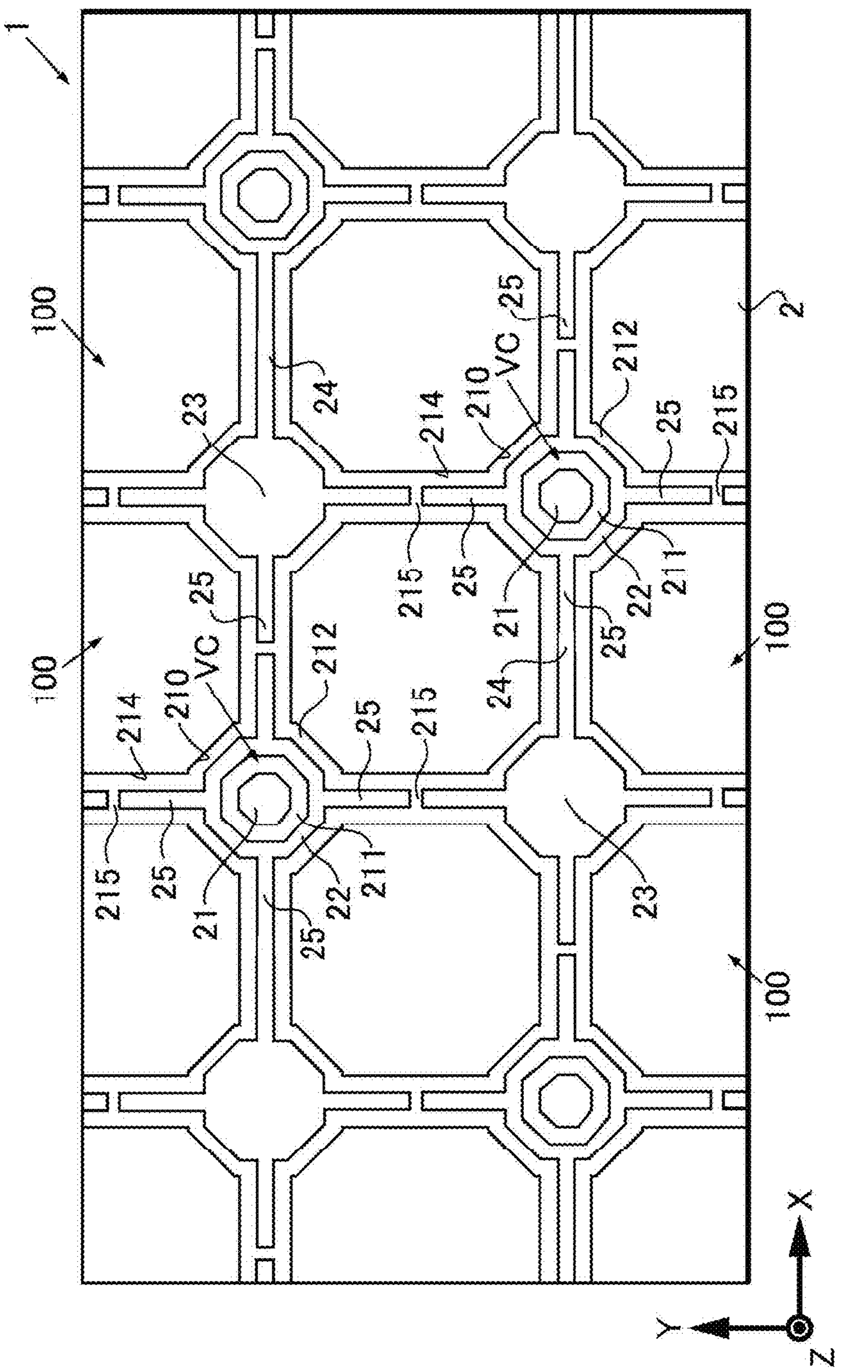
[ FIG. 22 ]

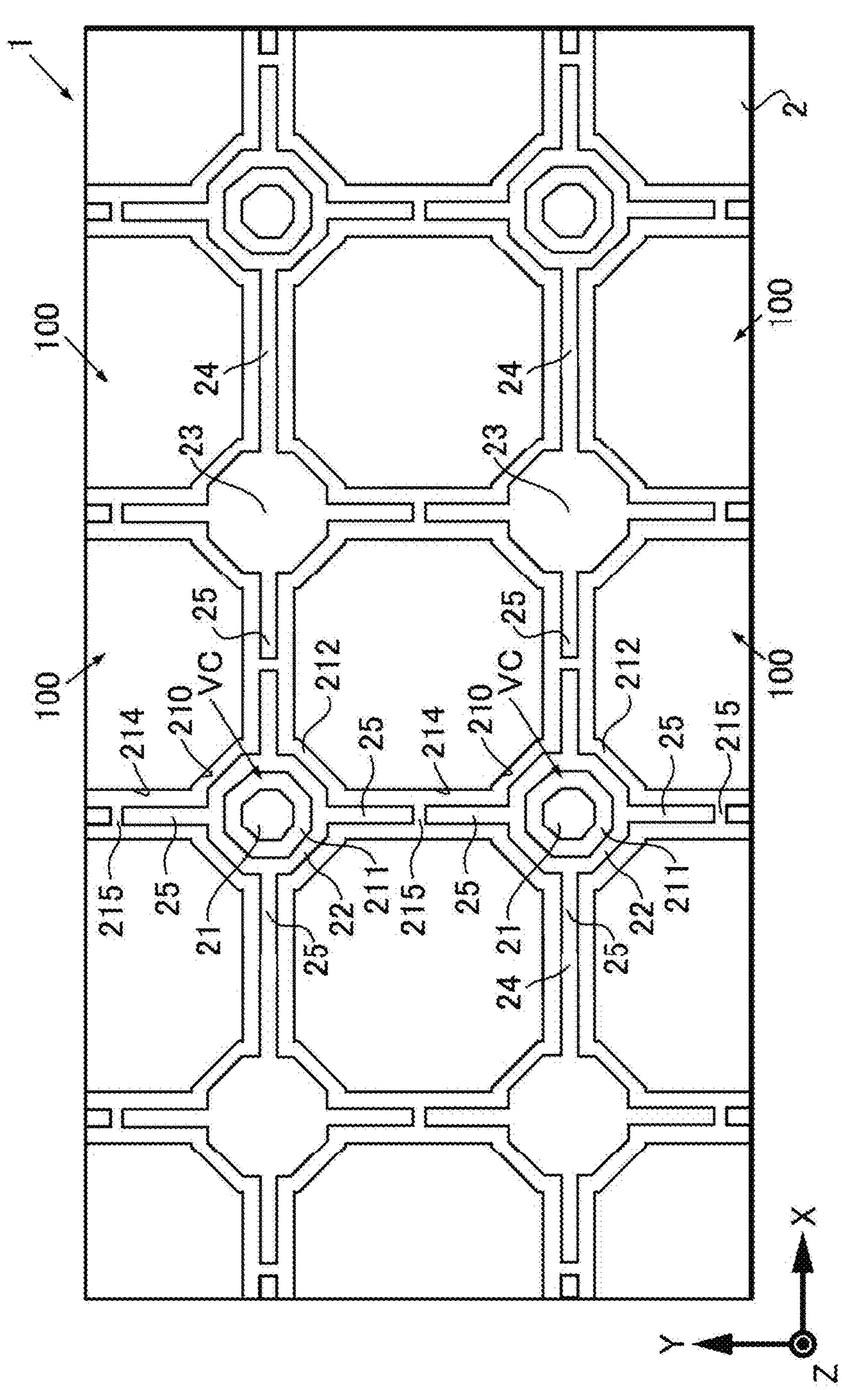
[FIG. 23]
1
2
100
100
100
100
24
24
23
23
25
25
VC
VC
212
212
210
210
214
214
25
25
215
215
215
215
25
25
21
21
22
22
211
211
25
25
24
X
Y
Z

SOLID-STATE IMAGING DEVICE TO REDUCE STRAY CAPACITANCE

CROSS REFERENCE TO RELATED APPLICATIONS

This application is a U.S. National Phase of International Patent Application No. PCT/JP2022/038565 filed on Oct. 17, 2022, which claims priority benefit of Japanese Patent Application No. JP 2021-200728 filed in the Japan Patent Office on Dec. 10, 2021. Each of the above-referenced applications is hereby incorporated herein by reference in its entirety.

TECHNICAL FIELD

The present disclosure relates to a solid-state imaging device.

BACKGROUND ART

Patent Literature 1 discloses a solid-state imaging device and an electronic device. In this solid-state imaging device, a plurality of photo-electric conversion regions is formed in a vertical direction in a pixel region. That is, in the vertical diction, there are formed: a red-light photoelectric conversion region in which light having a wavelength of red is converted into electric charge; a green-light photoelectric conversion region in which light having a wavelength of green is converted into electric charge; and a blue-light photoelectric conversion region in which light having a wavelength of blue is converted into electric charge. The red-light photoelectric conversion region and the blue-light photoelectric conversion region each include a photodiode formed within a semiconductor substrate. The green-light photoelectric conversion region is disposed at one of surfaces of the semiconductor substrate, and includes an organic photoelectric conversion layer, for example.

In a case of a back-illuminated type solid-state imaging device, a pixel circuit including a modulation transistor and a floating diffusion is formed at the other surface of the semiconductor substrate. The electric charge generated at the organic photoelectric conversion layer passes through a through-wiring (through electrode) that penetrates from the one surface of the semiconductor substrate to the other surface, and is transferred to the pixel circuit. The through-wiring is formed within a through-hole extending in the thickness direction of the semiconductor substrate, and is electrically insulated from the semiconductor substrate with an insulation film being interposed between them.

CITATION LIST

Patent Literature

Patent Literature 1: Japanese Unexamined Patent Application Publication No. 2020-174188

In the solid-state imaging device described above, a stray capacitance (electrical capacitance) including the through-wiring, the insulating body, and the semiconductor substrate is added to the through-wiring. As the capacitance value of the stray capacitance increases, the photoelectric conversion efficiency decreases, which leads to a deterioration in the quality of image signals. Meanwhile, in order to reduce the capacitance value of the stray capacitance, it is only necessary to increase the distance of separation between the through-wiring and the semiconductor substrate. However, this causes an increase in the footprint of the through-wiring, which makes it impossible to sufficiently secure the pixel region.

Thus, it is desired to provide a solid-state imaging device that makes it possible to sufficiently secure the pixel region while improving the quality of the pixel signals.

A solid-state imaging device according to a first embodiment of the present disclosure includes: a substrate including a first surface and a second surface that is opposed to the first surface; a first through-wiring that penetrates from the first surface of the substrate to the second surface of the substrate and through which electric charge is to be transferred; an electroconductive body formed in the substrate and along a periphery of a side surface of the first through-wiring with a dielectric body being interposed between the electroconductive body and the side surface; and a voltage supply circuit that supplies the electroconductive body with a voltage that causes a voltage difference between the first through-wiring and the electroconductive body to be small, when the electric charge is to be transferred to the first through-wiring.

A solid-state imaging device according to a second embodiment of the present disclosure includes: a substrate including a first surface and a second surface that is opposed to the first surface; a first photoelectric converter disposed on the first surface and converting light into electric charge; a first through-wiring that penetrates from the first surface of the substrate to the second surface of the substrate and through which the electric charge is to be transferred from the first photoelectric converter; an electroconductive body formed in the substrate and along a periphery of a side surface of the first through-wiring with a dielectric body being interposed between the electroconductive body and the side surface; a voltage supply circuit that supplies a predetermined voltage to the electroconductive body; a second photoelectric converter disposed in the substrate and at a position adjacent to the first through-wiring, the second photoelectric converter converting light into the electric charge; and a light shielding wall extending from the electroconductive body, the light shielding wall surrounding at least a portion of a periphery of a side surface of the second photoelectric converter, the light shielding wall having a higher light shielding property than the substrate.

BRIEF DESCRIPTION OF THE DRAWINGS

FIG. 1 is a longitudinal cross-sectional diagram illustrating the configuration of a pixel region and a pixel circuit of a solid-state imaging device according to a first embodiment.

FIG. 2 is a schematic configuration diagram illustrating the basic configuration of the main components of the pixel region and the pixel circuit illustrated in FIG. 1.

FIG. 3 is a schematic configuration diagram illustrating the specific configuration of the main components of the pixel region and the pixel circuit illustrated in FIG. 2.

FIG. 4 is a schematic configuration diagram illustrating the specific configuration including a voltage supply circuit and the main components of the pixel region and the pixel circuit illustrated in FIG. 3.

FIG. 5 is a specific longitudinal cross-sectional configuration view (cross-sectional view take along the line A-A illustrated in FIG. 6) including the voltage supply circuit and the main components of the pixel region and the pixel circuit illustrated in FIG. 4.

FIG. 6 is a plan view of the main components of the pixel region illustrated in FIG. 5.

FIG. 7 is a time chart illustrating operations of the voltage supply circuit illustrated in FIGS. 4 and 5.

FIG. 8 is a plan diagram illustrating the main components of a pixel region according to a modification example of the first embodiment and corresponding to FIG. 6.

FIG. 9 is a schematic configuration diagram illustrating the specific configuration including a voltage supply circuit and the main components of a pixel region and a pixel circuit of a solid-state imaging device according to the second embodiment, the view corresponding to FIG. 4.

FIG. 10 is a schematic configuration diagram illustrating the specific configuration including a voltage supply circuit and the main components of a pixel region and a pixel circuit of a solid-state imaging device according to a third embodiment of the present disclosure, the view corresponding to FIG. 4.

FIG. 11 is a time chart illustrating operations of the voltage supply circuit illustrated in FIG. 10.

FIG. 12 is a schematic configuration diagram illustrating the specific configuration including a voltage supply circuit and the main components of a pixel region and a pixel circuit of a solid-state imaging device according to a fourth embodiment of the present disclosure, the view corresponding to FIG. 10.

FIG. 13 is a specific longitudinal cross-sectional configuration view (cross-sectional view take along the line B-B illustrated in FIG. 14) including the main components of a pixel region and a pixel circuit of a solid-state imaging device according to a fifth embodiment of the present disclosure, the view corresponding to FIG. 5.

FIG. 14 is a plan view of the main components of the pixel region illustrated in FIG. 13, the view corresponding to FIG. 6.

FIG. 15 is a specific longitudinal cross-sectional configuration view (cross-sectional view take along the line C-C illustrated in FIG. 16) including a voltage supply circuit and the main components of a pixel region and a pixel circuit of a solid-state imaging device according to a sixth embodiment of the present disclosure, the view corresponding to FIG. 5.

FIG. 16 is a plan diagram illustrating the main components of a pixel region illustrated in FIG. 15, the view corresponding to FIG. 6.

FIG. 17 is a specific longitudinal cross-sectional configuration view (a cross-sectional view take along the line D-D illustrated in FIG. 18 and along the line E-E illustrated in FIG. 19) including a voltage supply circuit and the main components of a pixel region and a pixel circuit of a solid-state imaging device according to a seventh embodiment of the present disclosure, the view corresponding to FIG. 5.

FIG. 18 is a plan diagram illustrating the configuration of a through-wiring and an electroconductive body that are the main components of the pixel region illustrated in FIG. 17, the view corresponding to FIG. 6.

FIG. 19 is a plan diagram illustrating the configuration of coupling the through-wiring and the electroconductive body that are the main components of the pixel region illustrated in FIG. 17, the view corresponding to FIG. 18.

FIG. 20 is a plan diagram illustrating the configuration of a pixel region and a light shielding wall of a solid-state imaging device according to an eighth embodiment of the present disclosure, the view corresponding to FIG. 6.

FIG. 21 is a plan diagram illustrating the configuration of arrangement of pixel regions and light shielding walls of a solid-state imaging device according to a ninth embodiment of the present disclosure, the view corresponding to FIG. 20.

FIG. 22 is a plan diagram illustrating the configuration of arrangement of pixel regions and light shielding walls of a solid-state imaging device according to a tenth embodiment of the present disclosure, the view corresponding to FIG. 21.

FIG. 23 is a plan diagram illustrating the configuration of arrangement of pixel regions and light shielding walls of a solid-state imaging device according to an eleventh embodiment of the present disclosure, the view corresponding to FIG. 21.

MODES FOR CARRYING OUT THE INVENTION

Below, embodiment of the present disclosure will be described in detail with reference to the drawings. Note that description will be made in the following order.

1. First Embodiment

The first embodiment describes an example in which the present technology is applied to a solid-state imaging device. The first embodiment describes, in detail, the circuit configuration, the longitudinal cross-sectional configuration, the planar configuration of the main components in a pixel region, a pixel circuit, and a voltage supply circuit of a solid-state imaging device. In addition, the first embodiment also described operations of the voltage supply circuit. Furthermore, the first embodiment describes a modification example of the planar configuration of the pixel region.

2. Second Embodiment

The second embodiment describes an example in which the configuration of the pixel circuit of the solid-state imaging device according to the first embodiment is modified.

3. Third Embodiment

The third embodiment describes an example in which the configuration of the voltage supply circuit of the solid-state imaging device according to the first embodiment is modified.

4. Fourth Embodiment

The fourth embodiment describes an example in which the configuration of the voltage supply circuit of the solid-state imaging device according to the third embodiment is modified.

5. Fifth Embodiment

The fifth embodiment describes an example in which the configuration of an electroconductive body disposed in a pixel region of the solid-state imaging device according to the third embodiment is modified.

6. Sixth Embodiment

The sixth embodiment describes a first example. This first example modifies the configuration of coupling the electroconductive body disposed in the pixel region and the voltage supply circuit in the solid-state imaging device according to the first embodiment.

7. Seventh Embodiment

The seventh embodiment describes a second example. This second example modifies the configuration of coupling the electroconductive body disposed in the pixel region and the voltage supply circuit in the solid-state imaging device according to the first embodiment.

8. Eighth Embodiment

The eighth embodiment describes a first example. This first example modifies the configuration of the electroconductive body disposed in the pixel region in the solid-state imaging device according to the sixth embodiment. The eighth embodiment employs the configuration of the electroconductive body to configure a light shielding wall between pixel regions.

9. Ninth Embodiment

The ninth embodiment describes a first example. This first example modifies the configuration of the electroconductive body disposed in the pixel region and the configuration of the light shielding wall in the solid-state imaging device according to the eighth embodiment.

10. Tenth Embodiment

The tenth embodiment describes a second example. This second example modifies the configuration of the electroconductive body disposed in the pixel region and the configuration of the light shielding wall in the solid-state imaging device according to the eighth embodiment.

11. Eleventh Embodiment

The eleventh embodiment describes a third example. This third example modifies the configuration of the electroconductive body disposed in the pixel region and the configuration of the light shielding wall in the solid-state imaging device according to the eighth embodiment.

12. Other Embodiments

1. First Embodiment

A solid-state imaging device 1 according to the first embodiment will be described with reference to FIGS. 1 to 8.

Here, the arrowed X direction illustrated in the drawings on an as-necessary basis indicates one planar direction of a solid-state imaging device 1 disposed on a plane for the purpose of convenience. The arrowed Y direction indicates another planar direction perpendicular to the arrowed X direction. In addition, the arrowed Z direction indicates the upward direction perpendicular to the arrowed X direction and the arrowed Y direction. In other words, the arrowed X direction, the arrowed Y direction, and the arrowed Z direction exactly match the X axis direction, the Y axis direction, and the Z axis direction of a three-dimensional coordinate system, respectively.

Note that each of these directions is illustrated for the purpose of facilitating understanding of explanation, and is not intended to limit directions of the present technology.

[Configuration of Solid-State Imaging Device 1]

(1) Overall Configuration of Solid-State Imaging Device 1

FIG. 1 illustrates one example of the longitudinal cross-sectional configuration of a pixel circuit 10 and a pixel region where one pixel 100 of the solid-state imaging device 1 is disposed.

The solid-state imaging device 1 according to the first embodiment is configured to have a back-illuminated type. This solid-state imaging device 1 includes a substrate 2, a first through-wiring (first through electrode) 21, an electroconductive body 22, and a voltage supply circuit 9. In addition, the solid-state imaging device 1 includes a first photoelectric converter 5, a second photoelectric converter 7, a third photoelectric converter 8, and the pixel circuit 10.

(2) Configuration of Substrate 2

In the thickness direction that is the arrowed Z direction, the substrate 2 includes a first surface (upper surface) 2A extending in the arrowed X direction and the arrowed Y direction, and also includes a second surface (lower surface) 2B that is opposed to the first surface 2A and is parallel to the first surface 2A. The first surface 2A is a rear surface of the solid-state imaging device 1, and is at the light entering side. The second surface 2B is a front surface of the solid-state imaging device 1.

The substrate 2 employs a semiconductor substrate including a single crystal silicon (Si), for example. In this semiconductor substrate, a p-type well region having a first conductive type is formed.

(3) Configurations of First Photoelectric Converter 5, Second Photoelectric Converter 7, and Third Photoelectric Converter 8

The first photoelectric converter 5 is formed at the first surface 2A of the substrate 2 with a fixed charge film 3 and an insulation film 4 being sequentially interposed between the first photoelectric converter 5 and the first surface 2A.

The fixed charge film 3 is supplied with a negative fixed charge. For example, the fixed charge film 3 employs one or more materials selected from hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, aluminum nitride, hafnium oxynitride, and aluminum oxynitride. The fixed charge film 3 includes a single layer including the materials, or includes a multiple layer in which layers including two or more different materials from among the materials described above are stacked.

The insulation film 4 employs one or more dielectric body materials selected from silicon oxide (SiO), tetraethyl orthosilicate (TEOS), silicon nitride (SiN), and silicon oxynitride (SiNO), for example.

The first photoelectric converter 5 is configured such that a first transparent electrode 51, a photoelectric conversion film 52, and a second transparent electrode 53 are each sequentially stacked. The first photoelectric converter 5 converts light into electric charge. Each of the first transparent electrode 51 and the second transparent electrode 53 includes a transparent electrode material such as indium tin oxide (ITO), for example.

The photoelectric conversion film 52 is formed by using a photoelectric conversion material having sensitivity relative to green light, for example. As for this photoelectric conversion material, an organic photoelectric conversion material such as rhodamine-based dye, merocyanine-based dye, or quinacridone is used, for example. A protecting film 6 is formed at the first photoelectric converter 5.

The second photoelectric converter 7 and the third photoelectric converter 8 are formed within the substrate 2 that corresponds to one pixel 100. Each of the second photoelectric converter 7 and the third photoelectric converter 8 converts light into electric charge.

Although explanation of detailed structures is not provided, the second photoelectric converter 7 includes a photodiode disposed at the first surface 2A side of the substrate 2. The photodiode is formed at a p-n junction section between an n-type semiconductor region and a p-type semiconductor region. The second photoelectric converter 7 is configured to have sensitivity relative to blue light.

In addition, the third photoelectric converter 8 is disposed at the second surface 2B side of the substrate 2 and at a position that overlaps with the second photoelectric converter 7 as viewed from the arrowed Z direction (hereinafter, simply referred to as "in a plan view"). The third photoelectric converter 8 includes a photodiode having an absorption coefficient differing from the photodiode of the second photoelectric converter 7. The photodiode is formed at a p-n junction section between an n-type semiconductor region and a p-type semiconductor region, as with the photodiode of the second photoelectric converter 7. The third photoelectric converter 8 is configured to have sensitivity relative to red light.

In the second photoelectric converter 7, the electric charge generated from light through photoelectric conversion is outputted to a pixel circuit that is not illustrated in the drawing. Similarly, in the third photoelectric converter 8, the electric charge generated from light through photoelectric conversion is outputted to a pixel circuit that is not illustrated in the drawing.

(4) Configuration of Pixel Circuit 10

The pixel circuit 10 is disposed at the second surface 2B side of the substrate 2. In the first embodiment, the pixel circuit 10 includes a floating diffusion (Floating Diffusion) 101, an amplifier transistor 102, a reset transistor 103, and a selection transistor 104 (see FIG. 4). The electric charge photoelectrically converted from light by the first photoelectric converter 5 is inputted into the pixel circuit 10 illustrated in FIG. 1, and the pixel circuit 10 processes the electric charge. Furthermore, here, the cross-sectional structure of the floating diffusion 101, the amplifier transistor 102, and the reset transistor 103 is illustrated.

An insulating layer 200 is formed at the second surface 2B of the substrate 2. Multiple layers of wirings 201 are disposed within the insulating layer 200.

The floating diffusion 101 is formed by wirings 201.

The amplifier transistor 102 is disposed at the second surface 2B, and includes an n-channel insulation gate-type field effect transistor (IGFET: Insulated Gate Field Effect Transistor) as a second conductive type.

Here, the IGFET is used to mean that an MISFET (Metal Insulator Semiconductor Field Effect Transistor) and an MOSFET (Metal Oxide Semiconductor Field Effect Transistor) are included.

The amplifier transistor 102 includes a channel formation region, to which no reference character is attached, a gate insulation film 110, a control electrode (gate electrode) 111, and a pair of main electrodes 112. The gate insulation film 110 is formed in the channel formation region. The gate insulation film 110 employs a dielectric body material such as SiO or SiN, for example. The control electrode 111 is formed at an opposite side of the gate insulation film 110 from the channel formation region. The floating diffusion 101 is electrically coupled to the control electrode 111. The control electrode 111 employs a gate electrode material such as polycrystal Si, for example.

The pair of main electrodes 112 are disposed at the second surface 2B of the substrate 2, and are formed as an n-type semiconductor region. One of the pair of main electrodes 112 to which the reference character "S" is attached is used as a source electrode (output electrode), and the other one to which the reference character "D" is attached is used as a drain electrode (input electrode). The main electrode 112(D) is electrically coupled to a power-supply voltage VDD.

The reset transistor 103 is disposed at the second surface 2B, and is formed as an n-channel IGFET. As with the amplifier transistor 102, the reset transistor 103 includes a channel formation region to which no reference character is attached, a gate insulation film 110, a control electrode 111, and a pair of main electrodes 112.

In addition, the selection transistor 104, which is not illustrated in the drawing, is disposed at the second surface 2B, and is formed as an n-channel IGFET. The selection transistor 104 is formed so as to have a configuration similar to that of the amplifier transistor 102.

Note that the pixel circuit 10 may further include a FD-conversion gain switching transistor electrically coupled in series between the floating diffusion 101 and the reset transistor 103.

(5) Configuration of First Through-Wiring 21

The first through-wiring 21 is configured as a wiring (or an electrode) extending through the substrate 2 in the thickness direction. One end of the first through-wiring 21 at the first surface 2A side is electrically coupled to the first transparent electrode 51 of the first photoelectric converter 5. Specifically, the first through-wiring 21 is electrically coupled to the first transparent electrode 51 with an electrode 510 being interposed between them. In addition, the other end of the first through-wiring 21 at the second surface 2B side is electrically coupled to the floating diffusion 101.

The first through-wiring 21 having such a configuration transfers, to the floating diffusion 101, the electric charge generated at the first photoelectric converter 5 through photoelectric conversion from light.

More specifically, within a first penetrating groove (through hole) 210 extending from the first surface 2A of the substrate 2 to the second surface 2B, the first through-wiring 21 is provided to extend in the thickness direction of the substrate 2, and is formed so as to extend through the substrate 2. The first through-wiring 21 is electrically separated from the substrate 2 with an insulating body 212 being interposed between them. The insulating body 212 is formed at the side wall of the first penetrating groove 210.

FIG. 6 illustrates one example of the planar shape of the first through-wiring 21 and the first penetrating groove 210. The first through-wiring 21 is formed into a circular shape in a plan view. In other words, the first through-wiring 21 as a whole is formed into a cylindrical shape because it is provided so as to extend in the thickness direction of the substrate 2.

The opening shape of the first penetrating groove 210 is formed into a circular shape in a plan view as with the first through-wiring 21, and has a shape having one size larger than the circular shape of the first through-wiring 21.

The first through-wiring 21 includes one or more metal materials selected from Si, aluminum (Al), tungsten (W), titanium (Ti), cobalt (Co), platinum (Pt), palladium (Pd), copper (Cu), hafnium (Hf), and tantalum (Ta), for example. Here, Si includes phosphorus (P) serving as an impurity that causes a reduction in the resistance value, for example, serving as an n-type impurity.

(6) Configuration of Electroconductive Body 22

The electroconductive body 22 is disposed within the substrate 2 and also within the first penetrating groove 210.

More specifically, the electroconductive body 22 is formed between the side surface of the first through-wiring 21 and the inner wall of the first penetrating groove 210 along the periphery of the side surface of the first through-wiring 21 with a dielectric body 211 being interposed between the electroconductive body 22 and the side surface of the first through-wiring 21. In addition, the electroconductive body 22 is electrically separated from the substrate 2 with the insulating body 212 being interposed between the electroconductive body 22 and the substrate 2. The insulating body 212 is formed at the side wall of the first penetrating groove 210.

Such a configuration forms a variable capacitance VC in which the first through-wiring 21 serves as one-side electrode and the electroconductive body 22 serves as the other-side electrode with the dielectric body 211 being interposed between them.

The electroconductive body 22 includes one or more metal materials or a metallic compound material selected from Al, Cu, Co, W, Ti, Ta, nickel (Ni), molybdenum (Mo), chromium (Cr), iridium (Ir), platinum iridium (PtIr), titanium nitride (TiN), and tungsten silicide (WSi), for example.

The dielectric body 211 employs one or more dielectric body materials selected from SiO, TEOS, SiN, and SiNO, for example. Furthermore, the dielectric body 211 may be formed as a complex layer in which different types of dielectric body materials are stacked.

(7) Configuration of Voltage Supply Circuit 9

FIG. 2 illustrates one example of the schematic configuration of the variable capacitance VC added to the first through-wiring 21 and the voltage supply circuit 9 that supplies a voltage to the variable capacitance VC. FIG. 3 illustrates one example of the schematic configuration in which the reset transistor 103 of the pixel circuit 10 is further added to FIG. 2.

FIG. 2 illustrates the configuration of coupling the floating diffusion 101 and the amplifier transistor 102 in the pixel circuit 10. FIG. 3 illustrates the reset transistor 103 in addition to that. In the reset transistor 103, one of the pair of main electrodes 112 is coupled to the power-supply voltage VDD, and the other one is coupled to the control electrode 111 of the amplifier transistor 102 through the floating diffusion 101.

As illustrated in FIGS. 2 and 3, the voltage supply circuit 9 is electrically coupled to the electroconductive body 22 that constitutes the variable capacitance VC. When electric charge is transferred to the first through-wiring 21, the voltage supply circuit 9 supplies the electroconductive body 22 with a voltage that causes a voltage difference between the first through-wiring 21 and the electroconductive body 22 to be small. That is, the voltage supply circuit 9 supplies a predetermined voltage to the electroconductive body 22 serving as the other electrode of the variable capacitance VC.

In other words, the voltage supply circuit 9 supplies the electroconductive body 22 with a voltage that causes a voltage difference between the first through-wiring 21 and the electroconductive body 22 to be kept small and constant. This supplied voltage has the same phase as a voltage based on the electric charge transferred to the first through-wiring 21.

FIG. 4 illustrates one example of the circuit configuration of the voltage supply circuit 9. FIG. 5 illustrates one example of the specific sectional configuration of the voltage supply circuit 9.

FIG. 4 also illustrates the selection transistor 104. In the selection transistor 104, one of the pair of main electrodes 112 is coupled to the main electrode 112(S) at one side of the amplifier transistor 102, and the other one of the pair of main electrodes 112 is coupled to a signal line SL. The signal line SL is coupled to a current source load LC.

As illustrated in FIGS. 4 and 5, in the solid-state imaging device 1 according to the first embodiment, the main electrode 112(S) at one side of the amplifier transistor 102 of the pixel circuit 10 is electrically coupled to the electroconductive body 22, and the amplifier transistor 102 constitutes the voltage supply circuit 9. As illustrated in FIG. 5, at the second surface 2B, the main electrode 112(S) of the amplifier transistor 102 is electrically coupled to the electroconductive body 22 with a wiring 202 being interposed between them. The wiring 202 includes a single layer or a complex layer of a wiring material including polycrystal Si, a metal having a high melting point, silicide having a high melting point, or the like, for example.

[Operation of Solid-State Imaging Device 1]

FIG. 7 illustrates one example of a timing chart illustrating a reading-out operation of the solid-state imaging device 1. The vertical axis indicates a control signal ΦRST of the reset transistor 103, a control signal ΦTX of a transformer transistor that is not illustrated in the drawing, an electric potential of the first through-wiring 21, and an electric potential of the electroconductive body 22. In the drawing, the horizontal axis indicates time flowing from the left side toward the right side.

As illustrated in FIG. 7, in the voltage supply circuit 9, that is, the amplifier transistor 102, when the control electrode 111 is controlled on the basis of the electric charge transferred to the first through-wiring 21, the current flowing between the pair of main electrodes 112 is controlled.

More specifically, when the electric charge transferred to the first through-wiring 21 is at the high level, a voltage at a high level is applied to the control electrode 111 of the amplifier transistor 102. With this operation, a current flows from the main electrode 112(D) of the amplifier transistor 102 to the main electrode 112(S), and a current also flows through the electroconductive body 22. This enables the voltage supply circuit 9 to supply the electroconductive body 22 with a voltage that causes the voltage difference between the first through-wiring 21 and the electroconductive body 22 to be kept small and constant, this supplied voltage having the same phase as the voltage at the first through-wiring 21.

On the other hand, when the electric charge transferred to the first through-wiring 21 is at the low level, a voltage at a low level is applied to the control electrode 111 of the amplifier transistor 102. This turns the amplifier transistor 102 into the OFF state. Thus, no current flows between the pair of main electrodes 112 of the amplifier transistor 102. In addition, no current flows through the electroconductive body 22. With this operation, in the voltage supply circuit 9, the electroconductive body 22 is supplied with a voltage that has the same phase as the voltage of the first through-wiring 21 and causes the voltage difference between the first through-wiring 21 and the electroconductive body 22 to be kept small and constant.

Workings and Effects

The solid-state imaging device 1 according to the first embodiment includes the substrate 2, the first through-wiring 21, the electroconductive body 22, and the voltage supply circuit 9. The substrate 2 includes the first surface 2A and the second surface 2B that is opposed to the first surface 2A. The first through-wiring 21 penetrates from the first surface 2A of the substrate 2 to the second surface 2B, and transfers electric charge. The electroconductive body 22 is formed within the substrate 2 and along the periphery of the side surface of the first through-wiring 21 with the dielectric body 211 being interposed between the electroconductive body 22 and the side surface. When the electric charge is to be transferred to the first through-wiring 21, the voltage supply circuit 9 supplies the electroconductive body 22 with a voltage that causes a voltage difference between the first through-wiring 21 and the electroconductive body 22. In addition, the voltage supply circuit 9 supplies the electroconductive body 22 with a voltage that causes a voltage difference between the first through-wiring 21 and the electroconductive body 22 to be kept constant. This supplied voltage has the same phase as the voltage based on the electric charge transferred to the first through-wiring 21.

With this configuration, it is possible to reduce the stray capacitance (electrical capacitance) added to the first through-wiring 21. This makes it possible to improve the conversion efficiency of the electric charge transferred to the first through-wiring 21. Thus, it is possible to effectively improve the quality of image signals obtained at the pixel circuit 10.

Furthermore, it is possible to reduce the size of the substrate 2, specifically, it is possible to reduce the distance of separation between the inner wall of the first penetrating groove 210 and the first through-wiring 21. This makes it possible to reduce the footprint of the first penetrating groove 210 including the first through-wiring 21 at the first surface 2A and the second surface 2B of the substrate 2, which makes it possible to sufficiently secure the pixel region.

In addition, the solid-state imaging device 1 includes the first photoelectric converter 5 and the pixel circuit 10. The first photoelectric converter 5 is disposed at the first surface 2A of the substrate 2, and converts light into electric charge. The pixel circuit 10 is disposed at the second surface 2B of the substrate 2, and includes the floating diffusion 101 and the amplifier transistor 102 including the control electrode 111 electrically coupled to the floating diffusion. The first through-wiring 21 transfers the electric charge converted from the light in the first photoelectric converter 5, to the control electrode 111 of the amplifier transistor 102.

In addition, the amplifier transistor 102 includes the pair of main electrodes 112. One-side main electrode 112(S) of the pair of main electrodes 112 is electrically coupled to the electroconductive body 22 to constitute the voltage supply circuit 9.

With the configuration described above, the voltage supply circuit 9 is formed only by coupling the one-side main electrode 112(S) of the amplifier transistor 102 of the pixel circuit 10 to the electroconductive body 22. This makes it possible to easily form the voltage supply circuit 9. In addition, it is possible to easily form the voltage supply circuit 9 for each pixel circuit 10 or for each pixel 100 or each group of a plurality of pixels 100.

Modification Example

A solid-state imaging device 1 according to a modification example of the first embodiment will be described with reference to FIG. 8. Note that, in the solid-state imaging device 1 according to this modification example, the second embodiment and thereafter, the same reference characters are attached to the same constituent elements as or substantially the same constituent elements as the constituent elements of the solid-state imaging device 1 according to the first embodiment, and explanation thereof will not be repeated.

FIG. 8 illustrates one example of the planar configurations of the first through-wiring 21, the electroconductive body 22, and the first penetrating groove 210. In the solid-state imaging device 1 according to the modification example of the first embodiment, the planar shape of the first through-wiring 21 is formed into a regular octagonal shape in a plan view.

The electroconductive body 22 is formed along the periphery of the side surface of the first through-wiring 21 with the dielectric body 211 being interposed between them. The planar shape of the electroconductive body 22 is formed into a regular octagonal shape having one size larger than the first through-wiring 21.

Constituent elements other than those described above are similar to constituent elements of the solid-state imaging device 1 according to the first embodiment.

With the solid-state imaging device 1 according to the modification example of the first embodiment, it is possible to obtain workings and effects similar to the workings and effects obtained from the solid-state imaging device 1 according to the first embodiment.

Note that the planar shape of each of the first through-wiring 21 and the electroconductive body 22 is not limited to the circular shape or the octagonal shape, respectively. For example, the planar shape may be formed into a triangle shape, a quadrangle shape including a square shape and a rectangular shape, a pentagon or more polygonal shape except for the octagonal shape, an oval shape or the like.

2. Second Embodiment

A solid-state imaging device 1 according to the second embodiment will be described with reference to FIG. 9.

[Configuration of Solid-State Imaging Device 1]

FIG. 9 illustrates one example of the circuit configuration of the voltage supply circuit 9, and corresponds to FIG. 4.

The solid-state imaging device 1 according to the second embodiment does not include the selection transistor 104 of the pixel circuit 10 illustrated in FIG. 4. In other words, the main electrode 112(S) of the amplifier transistor 102 is coupled directly to the signal line SL.

Constituent elements other than those described above are similar to constituent elements of the solid-state imaging device 1 according to the first embodiment.

Workings and Effects

With the solid-state imaging device 1 according to the second embodiment, it is possible to obtain workings and effects similar to the workings and effects obtained from the solid-state imaging device 1 according to the first embodiment.

3. Third Embodiment

A solid-state imaging device 1 according to the third embodiment of the present disclosure will be described with reference to FIGS. 10 and 11.

[Configuration of Solid-State Imaging Device 1]

FIG. 10 illustrates one example of a circuit configuration of the voltage supply circuit 9, and corresponds to FIG. 4.

In the solid-state imaging device 1 according to the third embodiment, the circuit configuration of the pixel circuit 10 illustrated in FIG. 4 is substantially the same. That is, the pixel circuit 10 includes the floating diffusion 101, the amplifier transistor 102, the reset transistor 103, and the selection transistor 104.

Here, the voltage supply circuit 9 is disposed outside of the pixel circuit 10. Although detailed explanation of the circuit configuration is not given, the voltage supply circuit 9 includes a single-slope type analog-digital convertor, for example.

[Operation of Solid-State Imaging Device 1]

FIG. 11 illustrates one example of a timing chart illustrating a reading-out operation of the solid-state imaging device 1. The vertical axis indicates a control signal ΦRST of the reset transistor 103, a control signal ΦTX of a transformer transistor that is not illustrated in the drawing, an electric potential of the first through-wiring 21, and an electric potential of the electroconductive body 22. In the drawing, the horizontal axis indicates time passing from the left side toward the right side.

As illustrated in FIG. 11, in the voltage supply circuit 9, a voltage supplied to the electroconductive body 22 is controlled on the basis of the electric charge transferred to the first through-wiring 21.

More specifically, when the electric charge transferred to the first through-wiring 21 is at the high level, the electric charge is accumulated at the floating diffusion 101. The voltage supply circuit 9 supplies the electroconductive body 22 with a voltage that causes a voltage difference between the first through-wiring 21 and the electroconductive body 22 to be kept constant. This supplied voltage has the same phase as the voltage of the first through-wiring 21.

On the other hand, when the electric charge transferred to the first through-wiring 21 is at the low level, no electric charge is accumulated at the floating diffusion 101. The voltage supply circuit 9 supplies the electroconductive body 22 with a voltage that causes a voltage difference between the first through-wiring 21 and the electroconductive body 22 to be kept constant. This supplied voltage has the same phase as the voltage of the first through-wiring 21.

Workings and Effects

With the solid-state imaging device 1 according to the third embodiment, it is possible to obtain workings and effects similar to the workings and effects obtained from the solid-state imaging device 1 according to the first embodiment.

4. <Fourth Embodiment>

A solid-state imaging device 1 according to the fourth embodiment of the present disclosure will be described with reference to FIG. 12.

[Configuration of Solid-State Imaging Device 1]

FIG. 12 illustrates one example of a circuit configuration of the voltage supply circuit 9, and corresponds to FIG. 9.

In a case of the solid-state imaging device 1 according to the fourth embodiment, the selection transistor 104 is not provided in the solid-state imaging device 1 according to the third embodiment, as with the pixel circuit 10 illustrated in FIG. 9. In other words, the main electrode 112(S) of the amplifier transistor 102 is coupled directly to the signal line SL. The voltage supply circuit 9 is configured to have a circuit configuration similar to that of the voltage supply circuit 9 of the solid-state imaging device 1 according to the third embodiment.

Constituent elements other than those described above are similar to constituent elements of the solid-state imaging device 1 according to the third embodiment.

Workings and Effects

With the solid-state imaging device 1 according to the fourth embodiment, it is possible to obtain workings and effects similar to the workings and effects obtained from the solid-state imaging device 1 according to the third embodiment.

5. <Fifth Embodiment>

A solid-state imaging device 1 according to the fifth embodiment of the present disclosure will be described with reference to FIGS. 13 and 14.

[Configuration of Solid-State Imaging Device 1]

FIG. 13 illustrates one example of the specific sectional configuration of the voltage supply circuit 9, and corresponds to FIG. 5. FIG. 14 illustrates one example of the planar configurations of the first through-wiring 21, the electroconductive body 22, and the first penetrating groove 210, and corresponds to FIG. 8.

In the solid-state imaging device 1 according to the fifth embodiment, the electroconductive body 22 includes a semiconductor region (diffusion region) in the solid-state imaging device 1 according to the first embodiment. More specifically, the electroconductive body 22 is formed along the periphery of the side surface of the first through-wiring 21 with the dielectric body 211 being interposed between them, and is formed in the substrate 2 and along the side wall of the first penetrating groove 210. Here, the amplifier transistor 102 is formed as an n-channel IGFET, and hence, the electroconductive body 22 is formed as an n-type semiconductor region that can be formed integrally with the main electrode 112(S).

Here, the planar shape of each of the first through-wiring 21, the electroconductive body 22, and the first penetrating groove 210 is formed into a regular octagonal shape. These planar shapes may be formed into the circular shape illustrated in FIG. 6, or other shapes described above as examples.

For example, an n-type impurity is doped into the substrate 2 so as to be along the side wall of the first penetrating groove 210, thereby forming the electroconductive body 22. As for the n-type impurity, P or arsenic (As) is used, for example. The doping method includes using an ion implantation method or a solid-phase diffusing method.

In the solid-state imaging device 1 according to the fifth embodiment, the main electrode 112(S) of the amplifier transistor 102 and the electroconductive body 22 are integrally formed and are electrically coupled to each other, whereby the amplifier transistor 102 constitutes the voltage supply circuit 9.

Constituent elements other than those described above are similar to constituent elements of the solid-state imaging device 1 according to the first embodiment.

Workings and Effects

With the solid-state imaging device 1 according to the fifth embodiment, it is possible to obtain workings and effects similar to workings and effects obtained from the solid-state imaging device 1 according to the first embodiment.

In addition, in the solid-state imaging device 1, the electroconductive body 22 is formed as a semiconductor region. Furthermore, the electroconductive body 22 and the main electrode 112(S) of the amplifier transistor 102 are formed integrally. This makes it possible to couple them without the need of the wiring 202 illustrated, for example, in FIG. 5. Thus, it is possible to easily achieve the coupling structure between the voltage supply circuit 9 and the electroconductive body 22.

6. <Sixth Embodiment>

A solid-state imaging device 1 according to the sixth embodiment of the present disclosure will be described with reference to FIGS. 15 and 16.

[Configuration of Solid-State Imaging Device 1]

FIG. 15 illustrates one example of the specific sectional configuration of the voltage supply circuit 9, and corresponds to FIG. 5. FIG. 16 illustrates one example of the planar configurations of the first through-wiring 21, the electroconductive body 22, and the first penetrating groove 210, and corresponds to FIG. 8.

In the solid-state imaging device 1 according to the sixth embodiment, the electroconductive body 22 is electrically coupled to the main electrode 112(S) of the amplifier transistor 102 with a second through-wiring 23 being interposed between them in the solid-state imaging device 1 according to the first embodiment. The amplifier transistor 102 constitutes the voltage supply circuit 9, as in the solid-state imaging device 1 according to the first embodiment.

More specifically, the second through-wiring 23 is formed at a position spaced apart from the first through-wiring 21, so as to penetrate through within a second penetrating groove 213 that penetrates from the first surface 2A of the substrate 2 to the second surface 2B. Here, the planar shape of the second through-wiring 23 is formed into the same planar shape as the planar shape of the first through-wiring 21. The second through-wiring 23 is electrically separated from the substrate 2 such that the insulating body 212 formed at the inner wall of the second penetrating groove 213 is interposed between them.

One end of the second through-wiring 23 is electrically coupled, at the first surface 2A, to the electroconductive body 22 through the wiring 24. Here, one end of the second through-wiring 23 has a diameter expanded along the planar direction of the first surface 2A. The diameter of the outline of the planar shape of one end of the second through-wiring 23 is the same as the diameter of the outline of the planar shape of the electroconductive body 22.

The other end of the second through-wiring 23 is electrically coupled, at the second surface 2B, to the main electrode 112(S) of the amplifier transistor 102 through the wiring 201. As described above, the amplifier transistor 102 constitutes the voltage supply circuit 9.

In addition, here, the second through-wiring 23 includes the same electrically conductive material as the electroconductive body 22. Note that the second through-wiring 23 may include an electrically conductive material differing from the electroconductive body 22.

Constituent elements other than those described above are similar to constituent elements of the solid-state imaging device 1 according to the first embodiment.

Workings and Effects

With the solid-state imaging device 1 according to the sixth embodiment, it is possible to obtain workings and effects similar to the workings and effects obtained from the solid-state imaging device 1 according to the first embodiment.

In addition, in the solid-state imaging device 1, the second through-wiring 23 penetrates through from the first surface 2A of the substrate 2 to the second surface 2B and at a position spaced apart from the first through-wiring 21, and is electrically coupled to the electroconductive body 22 at the first surface 2A. In addition, at the second surface 2B, the second through-wiring 23 is electrically coupled to the one-side main electrode 112(S) of the amplifier transistor 102.

Thus, at the first surface 2A of the substrate 2 where layout rules for wirings are less strict than the second surface 2B of the substrate 2 where the pixel circuit 10 is disposed, the voltage supply circuit 9 is coupled to the electroconductive body 22 with the second through-wiring 23 and the wiring 24 being interposed between them. This makes it possible to easily achieve the coupling structure.

7. <Seventh Embodiment>

A solid-state imaging device 1 according to the seventh embodiment of the present disclosure will be described with reference to FIGS. 17 to 19.

[Configuration of Solid-State Imaging Device 1]

FIG. 17 illustrates one example of the specific sectional configuration of the voltage supply circuit 9, and corresponds to FIG. 15. FIGS. 18 and 19 illustrate one example of the planar configurations of the first through-wiring 21, the electroconductive body 22, the first penetrating groove 210, the second through-wiring 23, and the second penetrating groove 213, and correspond to FIG. 16.

In the solid-state imaging device 1 according to the seventh embodiment, the voltage supply circuit 9 is coupled to the electroconductive body 22 with the second through-wiring 23 and the wiring 24 being interposed between them, as with the solid-state imaging device 1 according to the sixth embodiment. Here, the second through-wiring 23 includes a through-wiring 23A and a through-wiring 23B.

More specifically, the through-wiring 23A of the second through-wiring 23 is provided so as to penetrate through within the second penetrating groove 213 extending from the first surface 2A of the substrate 2 to the second surface 2B. This through-wiring 23A includes the same electrically conductive material as the first through-wiring 21, and is formed so as to have the same cross-sectional structure as that of the first through-wiring 21.

On the other hand, the through-wiring 23B of the second through-wiring 23 is formed within the second penetrating groove 213 so as to be along the periphery of the side surface of the through-wiring 23A with the dielectric body 211 being interposed between the through-wiring 23B and the side surface. The through-wiring 23A includes the same electrically conductive material as the electroconductive body 22, and is formed so as to have the same cross-sectional structure as that of the electroconductive body 22. The through-wiring 23B is electrically coupled, at the first surface 2A, to the through-wiring 23B, and the through-wiring 23B is electrically coupled to the electroconductive body 22 through the wiring 24.

That is, the second through-wiring 23 is formed into the same cross-sectional structure as the cross-sectional structure of the first through-wiring 21 and the electroconductive body 22.

Constituent elements other than those described above are similar to constituent elements of the solid-state imaging device 1 according to the sixth embodiment.

Workings and Effects

With the solid-state imaging device 1 according to the seventh embodiment, it is possible to obtain workings and effects similar to the workings and effects obtained from the solid-state imaging device 1 according to the sixth embodiment.

Furthermore, in the solid-state imaging device 1, the second through-wiring 23 includes the through-wiring 23A and the through-wiring 23B. The second through-wiring 23 includes the same electrically conductive material as that of the first through-wiring 21 and the electroconductive body 22, and is formed so as to have the same cross-sectional structure. This makes it possible to easily achieve the structure of the second through-wiring 23.

In addition, in the method of manufacturing the solid-state imaging device 1, the step of forming the second through-wiring 23 is shared with the step of forming the first through-wiring 21 and the electroconductive body 22. This makes it possible to reduce the number of manufacturing steps.

8. <Eighth Embodiment>

A solid-state imaging device 1 according to the eighth embodiment of the present disclosure will be described with reference to FIG. 20.

[Configuration of Solid-State Imaging Device 1]

FIG. 20 illustrates one example of the planar configurations of the first through-wiring 21, the electroconductive body 22, and the first penetrating groove 210, and corresponds to FIG. 8.

The solid-state imaging device 1 according to the eighth embodiment includes the substrate 2, the first photoelectric converter 5, the first through-wiring 21, the electroconductive body 22, the voltage supply circuit 9, the second photoelectric converter 7, and the third photoelectric converter 8, as with the solid-state imaging device 1 according to the first embodiment, and also includes a light shielding wall 25.

The first photoelectric converter 5, the second photoelectric converter 7, and the third photoelectric converter 8 constitute the pixel 100. Pixels 100 are arranged regularly in the arrowed X direction and the arrowed Y direction.

The first through-wiring 21 is disposed at the center position of four pixels 100 in total arranged adjacent to each other in the arrowed X direction and arrowed Y direction. The electroconductive body 22 is formed at the periphery of the side surface of the first through-wiring 21 with the dielectric body 211 being interposed between them.

The first penetrating groove 210 in which the first through-wiring 21 and the electroconductive body 22 are disposed is coupled to a separation groove 214 formed at the periphery of the side surface of the pixel 100. The separation groove 214 is provided so as to extend in the arrowed X direction and the arrowed Y direction.

The light shielding wall 25 is provided so as to be embedded in the separation groove 214. The light shielding wall 25 is provided so as to extend from the electroconductive body 22 within the separation groove 214, and is formed so as to surround a portion of the periphery of the side surface of the pixel 100 including the first photoelectric converter 5 and the second photoelectric converter 7. The electroconductive body 22 and the light shielding wall 25 include an electrically conductive material having a higher light shielding property than the substrate 2.

A separation insulating body 215 is formed at a middle section of the separation groove 214 in the extending direction. The separation insulating body 215 is configured to electrically separate the light shielding wall 25 between pixels 100 adjacent in the extending direction of the separation groove 214.

In addition, the voltage supply circuit 9 is formed to have the same circuit as the voltage supply circuit 9 of the solid-state imaging device 1 according to the first embodiment. Furthermore, the voltage supply circuit 9 may be formed to have the same circuit as the voltage supply circuit 9 of the solid-state imaging device 1 according to the third embodiment. That is, the voltage supply circuit 9 is configured to supply the electroconductive body 22 with a predetermined voltage.

Constituent elements other than those described above are similar to constituent elements of the solid-state imaging device 1 according to the first embodiment or the third embodiment.

Workings and Effects

With the solid-state imaging device 1 according to the eighth embodiment, it is possible to obtain workings and effects similar to the workings and effects obtained from the solid-state imaging device 1 according to the first embodiment or the third embodiment.

In addition, the solid-state imaging device 1 includes the substrate 2, the first photoelectric converter 5, the first through-wiring 21, the electroconductive body 22, the voltage supply circuit 9, the second photoelectric converter 7, the third photoelectric converter 8, and the light shielding wall 25.

The substrate 2 includes the first surface 2A, and the second surface 2B that is opposed to the first surface 2A. The first photoelectric converter 5 is disposed at the first surface 2A, and converts light into electric charge. The first through-wiring 21 penetrates through from the first surface 2A of the substrate 2 to the second surface 2B, and is used to transfer electric charge from the first photoelectric converter 5. The electroconductive body 22 is formed, within the substrate 2, so as to be along the periphery of the side surface of the first through-wiring 21 with the dielectric body 211 being interposed between them. The voltage supply circuit 9 supplies the electroconductive body 22 with a predetermined voltage. (At least one of) the second photoelectric converter 7 and the third photoelectric converter 8 are disposed within the substrate 2 and at a position adjacent to the first through-wiring 21, and converts light into electric charge. In addition, the light shielding wall 25 is provided so as to extend from the electroconductive body 22, surrounds at least a portion of the periphery of the side surface of the second photoelectric converter 7 and the third photoelectric converter 8, and has a higher light shielding property than the substrate 2.

This configuration makes it possible to reduce the stray capacitance added to the first through-wiring 21, which makes it possible to improve the conversion efficiency of the electric charge transferred to the first through-wiring 21. Thus, it is possible to effectively improve the quality of image signals obtained at the pixel circuit 10.

In addition, it is possible to reduce the substrate 2, specifically reduce the distance of separation between the inner wall of the first penetrating groove 210 and the first through-wiring 21. This makes it possible to reduce the footprint of the first penetrating groove 210 including the first through-wiring 21 at the first surface 2A and the second surface 2B of the substrate 2, which makes it possible to sufficiently secure the pixel region.

Furthermore, at least a portion of the periphery of the side surface of the pixel 100 is surrounded by the light shielding wall 25 having a higher light shielding property than the substrate 2. This makes it possible to effectively reduce or prevent optical crosstalk between adjacent pixels 100.

Furthermore, in the solid-state imaging device 1, the light shielding wall 25 is formed by using the electroconductive body 22. This makes it possible to easily achieve the light shielding wall 25.

9. <Ninth Embodiment>

A solid-state imaging device 1 according to the ninth embodiment of the present disclosure will be described with reference to FIG. 21. Solid-state imaging devices 1 according to the ninth to eleventh embodiments are application examples of the solid-state imaging device 1 according to the eighth embodiment.

[Configuration of Solid-State Imaging Device 1]

FIG. 21 illustrates one example of the planar configurations of the pixel 100, the first through-wiring 21, the electroconductive body 22, the first penetrating groove 210, and the light shielding wall 25, and corresponds to FIG. 20.

The solid-state imaging device 1 according to the ninth embodiment is configured such that the first through-wiring 21 and the electroconductive body 22 of the solid-state imaging device 1 according to the eighth embodiment are arranged regularly in the arrowed X direction and the arrowed Y direction so as to match the arrangement pitch of pixels 100. In addition, the light shielding wall 25 provided so as to extend from the electroconductive body 22 is provided so as to extend between first through-wirings 21, and surrounds a portion of the periphery of the side surface of the pixel 100.

Constituent elements other than those described above are similar to constituent elements of the solid-state imaging device 1 according to the eighth embodiment.

Workings and Effects

With the solid-state imaging device 1 according to the ninth embodiment, it is possible to obtain workings and effects similar to the workings and effects obtained from the solid-state imaging device 1 according to the eighth embodiment.

10. <Tenth Embodiment>

A solid-state imaging device 1 according to the tenth embodiment of the present disclosure will be described with reference to FIG. 22.

[Configuration of Solid-State Imaging Device 1]

FIG. 22 illustrates one example of the planar configurations of the pixel 100, the first through-wiring 21, the electroconductive body 22, the first penetrating groove 210, the second through-wiring 23, the second penetrating groove 213, and the light shielding wall 25, and corresponds to FIG. 21.

The solid-state imaging device 1 according to the tenth embodiment is configured such that the first through-wiring 21 and the second through-wiring 23 are alternately arranged in the arrowed X direction and the arrowed Y direction in the solid-state imaging device 1 according to the ninth embodiment.

In addition, the first through-wiring 21 and the second through-wiring 23 alternately arranged in the arrowed X direction and arranged adjacent in the arrowed Y direction are positionally shifted by one arrangement pitch of pixels 100 with respect to the first through-wiring 21 and the second through-wiring 23 alternately arranged in the arrowed X direction.

Here, the second through-wiring 23 is the same constituent element as the second through-wiring 23 of the solid-state imaging device 1 according to the sixth embodiment. Furthermore, the second through-wiring 23 may be the same constituent element as the second through-wiring 23 of the solid-state imaging device 1 according to the seventh embodiment.

Constituent elements other than those described above are similar to constituent elements of the solid-state imaging device 1 according to the ninth embodiment.

Workings and Effects

With the solid-state imaging device 1 according to the tenth embodiment, it is possible to obtain workings and effects similar to the workings and effects obtained from the solid-state imaging device 1 according to the ninth embodiment.

11. <Eleventh Embodiment>

A solid-state imaging device 1 according to the eleventh embodiment of the present disclosure will be described with reference to FIG. 23.

[Configuration of Solid-State Imaging Device 1]

FIG. 23 illustrates one example of the planar configurations of the pixel 100, the first through-wiring 21, the electroconductive body 22, the first penetrating groove 210, the second through-wiring 23, the second penetrating groove 213, and the light shielding wall 25, and corresponds to FIG. 21.

The solid-state imaging device 1 according to the eleventh embodiment is configured such that the first through-wiring 21 and the second through-wiring 23 are alternately arranged in the arrowed X direction and the arrowed Y direction in the solid-state imaging device 1 according to the ninth embodiment.

In addition, the arrangement positions of the first through-wiring 21 and the second through-wiring 23 alternately arranged in the arrowed X direction and arranged adjacent in the arrowed Y direction match the first through-wiring 21 and the second through-wiring 23 alternately arranged in the arrowed X direction.

Constituent elements other than those described above are similar to constituent elements of the solid-state imaging device 1 according to the ninth embodiment.

Workings and Effects

With the solid-state imaging device 1 according to the eleventh embodiment, it is possible to obtain workings and effects similar to the workings and effects obtained from the solid-state imaging device 1 according to the ninth embodiment.

12. Other Embodiments

The present technology is not limited to the embodiments described above. Various modifications are possible without departing from the main points thereof.

For example, it may be possible to combine the solid-state imaging devices according to two or more embodiments from among the solid-state imaging devices according to the first to eleventh embodiments.

In the present disclosure, the solid-state imaging device includes the substrate, the first through-wiring, the electroconductive body, and the voltage supply circuit. The substrate includes the first surface and the second surface that is opposed to the first surface. The first through-wiring penetrates through from the first surface of the substrate to the second surface of the substrate, and electric charge is transferred through this first through-wiring. The electroconductive body is formed in the substrate and along a periphery of a side surface of the first through-wiring with the dielectric body being interposed between the electroconductive body and the side surface. When the electric charge is to be transferred to the first through-wiring, the voltage supply circuit supplies the electroconductive body with the voltage that causes the voltage difference between the first through-wiring and the electroconductive body to be small. In addition, the voltage supply circuit supplies the electroconductive body with the voltage that causes the voltage difference between the first through-wiring and the electroconductive body to be kept constant. This supplied voltage has the same phase as the voltage based on the electric charge transferred to the first through-wiring.

With the configuration described above, it is possible to reduce the stray capacitance added to the first through-wiring. This makes it possible to improve the conversion efficiency of the electric charge transferred to the first through-wiring. Thus, it is possible to effectively improve the quality of image signals obtained at the pixel circuit.

In addition, it is possible to reduce the distance of separation between the substrate and the first through-wiring. Thus, it is possible to reduce the footprint of the substrate at the first surface and the second surface, which makes it possible to sufficiently secure the pixel region.

Furthermore, in the present disclosure, the solid-state imaging device includes the substrate, the first photoelectric converter, the first through-wiring, the electroconductive body, the voltage supply circuit, the second photoelectric converter (and the third photoelectric converter), and the light shielding wall.

The substrate includes the first surface and the second surface that is opposed to the first surface. The first photoelectric converter is disposed at the first surface, and converts light into electric charge. The first through-wiring penetrates through from the first surface of the substrate to the second surface of the substrate, and the electric charge is transferred from the first photoelectric converter through this first through-wiring. The electroconductive body is formed in the substrate and along a periphery of a side surface of the first through-wiring with the dielectric body being interposed between the electroconductive body and the side surface. The voltage supply circuit supplies a predetermined voltage to the electroconductive body. The second photoelectric converter is disposed in the substrate and at a position adjacent to the first through-wiring, and converts light into electric charge. In addition, the light shielding wall extends from the electroconductive body. The light shielding wall surrounds at least a portion of a periphery of a side surface of the second photoelectric converter. The light shielding wall has a higher light shielding property than the substrate.

With the configuration described above, it is possible to reduce the stray capacitance added to the first through-wiring. This makes it possible to improve the conversion efficiency of the electric charge transferred to the first through-wiring. Thus, it is possible to effectively improve the quality of image signals obtained at the pixel circuit.

In addition, it is possible to reduce the distance of separation from the substrate. Thus, it is possible to reduce the footprint of the substrate at the first surface and the second surface, which makes it possible to sufficiently secure the pixel region.

Furthermore, at least a portion of the periphery of the side surface of the pixel is surrounded by the light shielding wall having a higher light shielding property than the substrate. This makes it possible to effectively reduce or prevent optical crosstalk between adjacent pixels.

<Configuration of Present Technology>

The present technology has the following configurations. With the following configurations being provided, it is possible to provide a solid-state imaging device that makes it possible to improve the quality of pixel signals and also sufficiently secure the pixel region. In addition, it is possible to provide a solid-state imaging device that makes it possible to effectively reduce optical crosstalk or prevent the optical crosstalk.

(1)

A solid-state imaging device including:

a substrate including a first surface and a second surface that is opposed to the first surface;

a first through-wiring that penetrates from the first surface of the substrate to the second surface of the substrate and through which electric charge is to be transferred;

an electroconductive body formed in the substrate and along a periphery of a side surface of the first through-wiring with a dielectric body being interposed between the electroconductive body and the side surface; and a voltage supply circuit that supplies the electroconductive body with a voltage that causes a voltage difference between the first through-wiring and the electroconductive body to be small, when the electric charge is to be transferred to the first through-wiring.

(2)

The solid-state imaging device according to (1) described above, further including:

a first photoelectric converter disposed on the first surface of the substrate and converting light into the electric charge; and a pixel circuit disposed on the second surface of the substrate, and including a floating diffusion and an amplifier transistor, the amplifier transistor including a control electrode electrically coupled to the floating diffusion, in which the first through-wiring is configured to transfer, to the control electrode, the electric charge converted from the light in the first photoelectric converter.

(3)

The solid-state imaging device according to (2) described above, in which the amplifier transistor includes a pair of main electrodes, and one of a pair of the main electrodes of the amplifier transistor is electrically coupled to the electroconductive body to constitute the voltage supply circuit.

(4)

The solid-state imaging device according to (3) described above, in which one of the main electrodes of the amplifier transistor is electrically coupled, at the second surface, to the electroconductive body.

(5)

The solid-state imaging device according to (3) described above, further including:

a second through-wiring that penetrates through from the first surface of the substrate to the second surface of the substrate at a position spaced apart from the first through-wiring, the second through-wiring being electrically coupled, at the first surface, to the electroconductive body, the second through-wiring being electrically coupled, at the second surface, to one of the main electrodes of the amplifier transistor.

(6)

The solid-state imaging device according to (5) described above, in which the second through-wiring includes a same electrically conductive material as the first through-wiring, and is formed to have a same cross-sectional structure.

(7)

The solid-state imaging device according to any one of (1) to (6) described above, in which the voltage supply circuit supplies the electroconductive body with the voltage that causes the voltage difference between the first through-wiring and the electroconductive body to be kept constant, the supplied voltage being in phase with a voltage based on the electric charge to be transferred to the first through-wiring.

(8)

The solid-state imaging device according to any one of (1) to (7) described above, further including:

a second photoelectric converter disposed within the substrate and at a position adjacent to the first through-wiring, and converting light into electric charge; and a light shielding wall extending from the electroconductive body, the light shielding wall surrounding at least a portion of a periphery of a side surface of the second photoelectric converter, the light shielding wall having a higher light shielding property than the substrate.

(9)

The solid-state imaging device according to any one of (1) to (8) described above, in which the first through-wiring includes one or more metal materials selected from Si, Al, W, Ti, Co, Pt, Pd, Cu, Hf, and Ta.

(10)

The solid-state imaging device according to any one of (1) to (9) described above, in which the electroconductive body includes a metal material, a metallic compound material, or a semiconductor region that includes one or more selected from Al, Cu, Co, W, Ti, Ta, Ni, Mo, Cr, Ir, PtIr, TiN, and WSi.

(11)

A solid-state imaging device including:

a substrate including a first surface and a second surface that is opposed to the first surface;

a first photoelectric converter disposed on the first surface and converting light into electric charge;

a first through-wiring that penetrates from the first surface of the substrate to the second surface of the substrate and through which the electric charge is to be transferred from the first photoelectric converter;

an electroconductive body formed in the substrate and along a periphery of a side surface of the first through-wiring with a dielectric body being interposed between the electroconductive body and the side surface;

a voltage supply circuit that supplies a predetermined voltage to the electroconductive body;

a second photoelectric converter disposed in the substrate and at a position adjacent to the first through-wiring, the second photoelectric converter converting light into the electric charge; and a light shielding wall extending from the electroconductive body, the light shielding wall surrounding at least a portion of a periphery of a side surface of the second photoelectric converter, the light shielding wall having a higher light shielding property than the substrate.

(12)

The solid-state imaging device according to (11) described above, further including:

a pixel circuit disposed on the second surface of the substrate, and including a floating diffusion and an amplifier transistor, the amplifier transistor including a control electrode electrically coupled to the floating diffusion, in which the amplifier transistor includes a pair of main electrodes, and one of a pair of the main electrodes of the amplifier transistor is electrically coupled to the electroconductive body to constitute the voltage supply circuit.

(13)

The solid-state imaging device according to (11) described above, in which the voltage supply circuit supplies the electroconductive body with a predetermined voltage that causes a voltage difference between the first through-wiring and the electroconductive body to be kept constant, the predetermined voltage being in phase with a voltage based on the electric charge to be transferred to the first through-wiring.

This application claims priority based on Japanese Patent Application No. 2021-200728 filed on Dec. 10, 2021 with Japan Patent Office, the entire contents of which are incorporated in this application by reference.

It should be understood that those skilled in the art would make various modifications, combinations, sub-combinations and alterations in accordance with design requirements and other factors, and they are within the scope of the appended claims or the equivalents thereof.

The invention claimed is:

1. A solid-state imaging device, comprising:

a substrate including a first surface and a second surface that is opposite to the first surface;

a first through-wiring that penetrates from the first surface of the substrate to the second surface of the substrate, wherein the first through-wiring is configured to transfer an electric charge;

an electroconductive body in the substrate, wherein the electroconductive body is along a periphery of a side surface of the first through-wiring;

a dielectric body between the electroconductive body and the side surface of the first through-wiring; and a voltage supply circuit configured to supply a first voltage to the electroconductive body, wherein the first voltage causes a voltage difference between the first through-wiring and the electroconductive body to be small, at a time of the transfer of the electric charge to the first through-wiring.

2. The solid-state imaging device according to claim 1, further comprising:

a first photoelectric converter on the first surface of the substrate, wherein the first photoelectric converter is configured to convert light into the electric charge; and a pixel circuit on the second surface of the substrate, wherein the pixel circuit includes a floating diffusion and an amplifier transistor, the amplifier transistor includes a control electrode that is electrically coupled to the floating diffusion, and the first through-wiring is configured to transfer, to the control electrode, the electric charge converted from the light in the first photoelectric converter.

3. The solid-state imaging device according to claim 2, wherein the amplifier transistor includes a pair of main electrodes, and one of the pair of the main electrodes is electrically coupled to the electroconductive body to constitute the voltage supply circuit.

4. The solid-state imaging device according to claim 3, wherein the one of the pair of the main electrodes is electrically coupled, at the second surface of the substrate, to the electroconductive body.

5. The solid-state imaging device according to claim 3, further comprising a second through-wiring that penetrates through from the first surface of the substrate to the second surface of the substrate at a position spaced apart from the first through-wiring, wherein the second through-wiring is electrically coupled, at the first surface of the substrate, to the electroconductive body, and the second through-wiring is electrically coupled, at the second surface of the substrate, to the one of the pair of the main electrodes.

6. The solid-state imaging device according to claim 5, wherein the second through-wiring includes an electrically conductive material same as an electrically conductive material of the first through-wiring, and the second through-wiring has a cross-sectional structure same as a cross-sectional structure of the first through-wiring.

7. The solid-state imaging device according to claim 1, wherein the first voltage causes the voltage difference between the first through-wiring and the electroconductive body to be kept constant, and the first voltage is in phase with a second voltage based on the electric charge to be transferred to the first through-wiring.

8. The solid-state imaging device according to claim 1, further comprising:

a second photoelectric converter within the substrate, wherein the second photoelectric converter is at a position adjacent to the first through-wiring, and the second photoelectric converter is configured to convert light into the electric charge; and a light shielding wall that extends from the electroconductive body, wherein the light shielding wall surrounds at least a portion of a periphery of a side surface of the second photoelectric converter, and the light shielding wall has a higher light shielding property than the substrate.

9. The solid-state imaging device according to claim 1, wherein the first through-wiring includes a metal material that includes at least one of Si, Al, W, Ti, Co, Pt, Pd, Cu, Hf, or Ta.

10. The solid-state imaging device according to claim 1, wherein the electroconductive body includes one of a metal material, a metallic compound material, or a semiconductor region, and the electroconductive body includes at least one of Al, Cu, Co, W, Ti, Ta, Ni, Mo, Cr, Ir, PtIr, TiN, or WSi.

11. A solid-state imaging device, comprising:

a substrate including a first surface and a second surface that is opposite to the first surface;

a first photoelectric converter on the first surface of the substrate, wherein the first photoelectric converter is configured to convert light into an electric charge;

a first through-wiring that penetrates from the first surface of the substrate to the second surface of the substrate, wherein the first through-wiring is configured to transfer the electric charge from the first photoelectric converter;

an electroconductive body in the substrate, wherein the electroconductive body is along a periphery of a side surface of the first through-wiring;

a dielectric body between the electroconductive body and the side surface of the first through-wiring;

a voltage supply circuit configured to supply first voltage to the electroconductive body, wherein the first voltage causes a voltage difference between the first through-wiring and the electroconductive body to be kept constant, and the first voltage is in phase with a second voltage based on the electric charge to be transferred to the first through-wiring;

a second photoelectric converter in the substrate, wherein the second photoelectric converter is at a position adjacent to the first through-wiring, and the second photoelectric converter is configured to convert the light into the electric charge; and a light shielding wall that extends from the electroconductive body, wherein the light shielding wall surrounds at least a portion of a periphery of a side surface of the second photoelectric converter, and the light shielding wall has a higher light shielding property than the substrate.

12. The solid-state imaging device according to claim 11, further comprising:

a pixel circuit on the second surface of the substrate, wherein the pixel circuit includes a floating diffusion and an amplifier transistor, the amplifier transistor includes a control electrode that is electrically coupled to the floating diffusion, the amplifier transistor includes a pair of main electrodes, and one of the pair of the main electrodes of the amplifier transistor is electrically coupled to the electroconductive body to constitute the voltage supply circuit.

* * * * *